(12) United States Patent
Morrish

(10) Patent No.: US 6,369,527 B1
(45) Date of Patent: Apr. 9, 2002

(54) VERTICAL BLANKING CIRCUIT AND BIAS CLAMP BOOST SUPPLY

(75) Inventor: Andrew Morrish, Saratoga, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/599,202

(22) Filed: Jun. 22, 2000

Related U.S. Application Data

(60) Provisional application No. 60/153,013, filed on Sep. 9, 1999.

(51) Int. Cl.[7] .................................................. G09G 1/04
(52) U.S. Cl. ...................................... 315/383; 348/379
(58) Field of Search ................................. 315/383, 384, 315/385, 386, 387; 348/379, 380, 689, 691, 707

(56) References Cited

U.S. PATENT DOCUMENTS 3,735,029 A * 5/1973 Sunstein ..................... 348/380

* cited by examiner

*Primary Examiner*—Don Wong
*Assistant Examiner*—Thuy Vinh Tran
(74) *Attorney, Agent, or Firm*—Mark A. DallaValle; Wildman, Harrold, Allen & Dixon

(57) ABSTRACT

A vertical blanking amplifier and bias clamp boost supply in accordance with the present invention uses the amplified vertical blanking signal to generate the boosted high voltage needed for powering the bias clamp circuits. A latch circuit is used to effectively lengthen the duration of the first vertical blanking pulse so as to ensure that the boosted power supply voltage is generated in the short time interval of one or two vertical scan intervals.

21 Claims, 29 Drawing Sheets

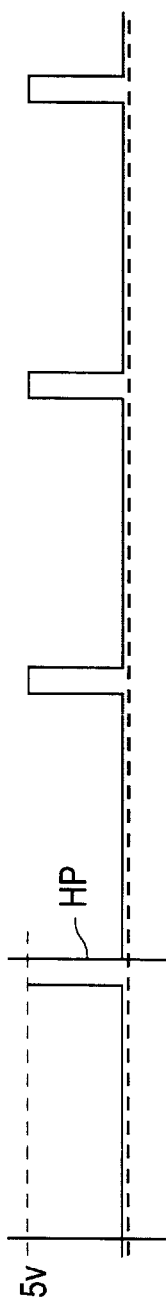
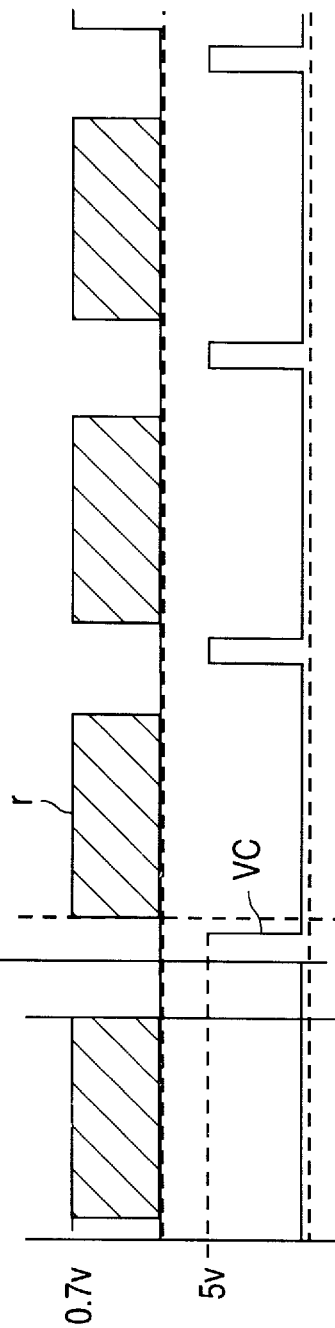
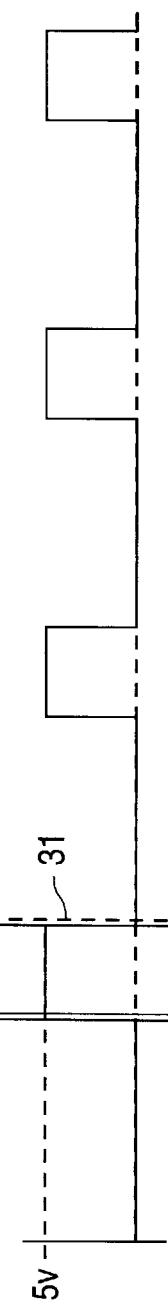
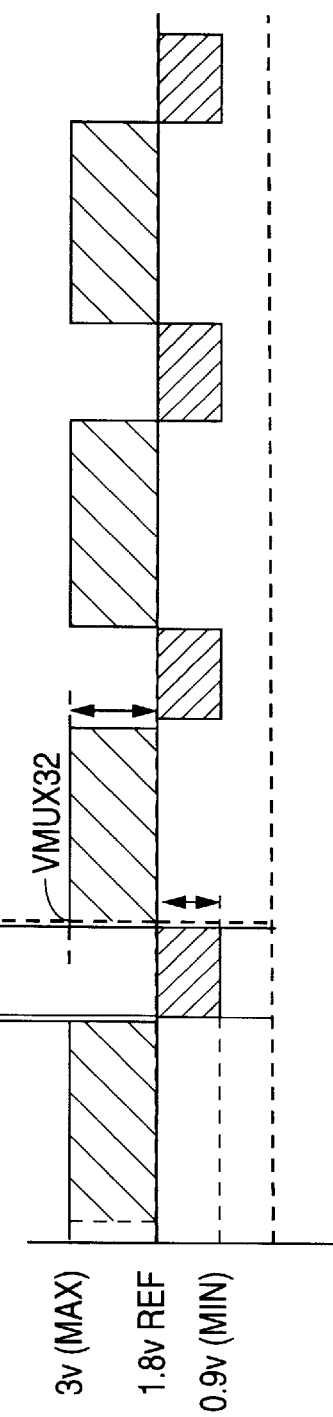
FIG. 8A
FIG. 8B
FIG. 8C
FIG. 8D
FIG. 8E

VERTICAL BLANKING CIRCUIT AND BIAS CLAMP BOOST SUPPLY

RELATED APPLICATIONS

This application claims the benefit of U.S. Provisional Application No. 60/153,013, filed Sep. 9, 1999. This application is also related to U.S. patent application Ser. No. 09/271,027, now U.S. Pat. No. 6,208,094, filed Mar. 17, 1999, and entitled "Multiplexed Video Interface System," and to U.S. patent application Ser. No. 09/348,533, now U.S. Pat. No. 6,166,579, filed Jul. 7, 1999, and entitled "Digitally Controlled Signal Magnitude Control Circuit." The disclosure of each of the foregoing applications is incorporated herein by reference.

BACKGROUND OF THE INVENTION

1. Field of the Invention

The present invention relates to boosted power supplies of the type commonly found in a display device using a cathode ray tube (CRT), and in particular, to a circuit for generating such a boosted power supply potential using the vertical blanking signal pulses.

2. Description of the Related Art

A computer system essentially comprises a system unit housing a microprocessor, computer memory, and various other support logic, as well as various input/output (I/O) devices which are connected to the system unit and enable a user to intelligently interact with the system unit. Examples of various types of input devices include a keyboard, a mouse, a trackball, and a pen computer, as well as others. The primary output device in a computer system include a video display monitor (video monitor).

Video monitors, such as for use with digital computers, include a cathode ray tube (CRT), and driver circuitry including a video amplifier. The CRT includes three primary color cathode ray guns which are manipulated to converge on a screen that produces the color image. The three guns produce converged scanning rasters having red, green and blue fields which combine to produce white light. The typical scanning raster is a left to right horizontal and top to bottom vertical scan operated in accordance with the Video Electronics Standards Association (VESA) requirements.

A conventional monitor amplifier circuit 100 for displaying screen control states of a monitor is illustrated in FIG. 1. In general, low level color video signals blue b, red r, and green g from a video source (not shown), such as a personal computer (PC) are provided to respective video preamplifiers 101a, 101b and 101c. These preamplifiers in turn provide the respective video signals blue b, red r, and green g, via buffer amplifiers BUFF 11, BUFF12, BUFF13, to video output driver stages 103a, 103b, 103c which supply high level amplified color video signals B, R and G to respective cathode intensity control electrodes of a CRT (not shown). As can be seen, in FIG. 1, each video signal blue b, red r, and green g is applied to a respective amplifier circuit AMP11–AMP13, each of which includes four main components: a video preamplifier 101a–101c, a bias/brightness circuit 105a–105c, a video amplifier 103a–103c, and a clamp amplifier 107a–107c. Since the monitor amplifier circuits AMP11–AMP13 are identical in structure and operation, only the circuit operation of amplifier circuit AMP12 for the red video signal r will be discussed by referring to FIG. 2.

As can be seen in FIG. 2, the four main components of monitor amplifier circuit AMP12 are numbered 1–4, number 1 being bias/brightness circuit 105b, number 2 being video preamplifier 101b, number 3 being clamp amplifier 107b, and number 4 being video amplifier 103b.

Operation of this red video channel r is as follows. Terminal 10 constitutes the red video signal input r which originates from an external source, such as a PC. Capacitor CAP12 couples the red video signal r to the noninverting input of video preamplifier 101b.

At this point, the amplification of red video signal r is controlled by a single-throw switch SW12 and a video clamp pulse VC. In any video signal, the clamp pulses are developed just following the synchronization pulses and make it possible to restore the voltage reference level of a video signal, in this case red video signal r. This clamp pulse VC is located in the "back porch" of the composite red video signal r and is employed to operate switch SW12. When clamp pulse VC is high, switch SW12 is closed. Thus, each time the CRT scans a horizontal line, capacitor CAP12 will be charged to black level reference voltage VREF, which is the potential reference level of the black region of an image. This level corresponding to the black color in an image makes it possible to restore the potential reference level of the red video signal r, this level having disappeared on account of the presence of the input capacitor CAP12.

On the other hand, when video clamp pulse VC is low, switch SW12 opens and red video signal r is applied directly to video preamplifier 101b, which is shown in FIG. 2 as a unity gain amplifier. Thus, red video signal r is passed through video preamplifier 101b.

At this point, the amplification of red video signal r is controlled by double-throw switch SW14 and signal 11. Signal 11 represents a horizontal blanking pulse that is derived from the display scanning circuits in a manner well known in video display monitors. This signal 11 is employed to operate a double-throw switch SW14 which switches the input IN12 to output buffer BUFF12, between the output of video preamplifier 101b and circuit ground. When signal 11 is high, input IN12 couples to video preamplifier 101b, the output of which is inversely amplified by video amplifier 103b to a voltage level suitable for driving a CRT and then applied to cathode electrodes of the CRT. On the other hand, when signal 11 is low, input IN12 is at circuit ground and the CRT is blanked by driving the output of the video amplifier 103b to a high level.

During operation of this amplifier circuit AMP12, output coupling capacitor CAP 22 changes the DC level at the CRT cathode. Thus, a bias clamp circuit 105b is used to restore the DC level at the CRT cathode through a series diode D11. Bias clamp circuit 105b outputs a bias clamp DC voltage which, in a typical video monitor, is usually factory set. This bias clamp voltage reinstates the charge on output capacitor CAP22 only during the blanking period. The voltage is preset, typically, in the range of 100–140 volts to compensate for differences in CRT cathode bias levels, required by each cathode in the CRT to set the black level. In addition, an adjustable voltage component of typically +/−10 volts may be added to this bias level to accomplish the 'brightness' feature, such that the black level can be manually adjusted by an external source. Thus, for example, increased image brightness results when the bias clamp voltage is reduced. This results in a less positive DC bias potential at the red cathode and a related increase in image brightness.

Although the conventional monitor amplifier system 100 amplifies and conditions video signals to drive the CRT, there are several disadvantages to the circuit configuration. Referring again to FIG. 1, it can be seen that this architecture involves a significant number of interconnections. Such a low level of integration has several disadvantages. First, the circuit architecture requires a large printed circuit board (PCB), yielding higher design costs due to shielding for the radio frequency (RF) interface. Second, the conventional circuit architecture has inferior high frequency performance due to long interconnection traces between the components and due to electromagnetic interference (EMI) stemming from long signal lines and large signal swings across the video interface between each preamplifier 101*a*–101*c* and corresponding video amplifier 103*a*–103*c*. Third, the high number of interconnections require higher pin count packages which are undesirably large and expensive. Finally, the complexity of the system 100 due to the low level of integration results in longer design time.

Referring to FIG. 3, a conventional video display circuit 200*a* shown in more detail includes, as three of its primary integrated circuits, a pre-amplifier 202, an on-screen display (OSD) generator and pulse width modulation (PWM) circuit 204, and a CRT driver 206, interconnected substantially as shown. The pre-amplifier 202 clamps and amplifies the component blue 201*b*, green 201*g* and red 201*r* video signals, while providing gain and contrast control as well as the ability to introduce OSD characters. The OSD and PWM circuit 204 receives the horizontal 201*h* and vertical 201*v* blanking signals and a set 201*i* of control signals (based upon the well-known I2C signal standard) and in accordance therewith generates OSD character information signals 205*o* and gain and contrast control signals 205*pa* for the pre-amplifier 202.

The PWM control signals 205*pa*, 205*pb*, 205*pc* are filtered by a PWM filter circuit 208 to provide corresponding filtered control signals 205*paf*, 205*pbf*, 205*pcf*.

The horizontal 201*h* and vertical 201*v* blanking signals are also combined in a buffer circuit 216 to produce a composite blanking signal 217 for the pre-amplifier 202.

The amplified and clamped component video signals 203*b*, 203*g*, 203*r* are further amplified by the CRT driver 206 to produce the higher voltage component video signals 207*b*, 207*g*, 207*r* needed to drive the CRT. These signals, 207*b*, 207*g*, 207*r* are themselves clamped using DC clamp signals 211*b*, 211*g*, 211*r* provided by a high voltage DC clamp circuit 210 which receives its control signals 205*pbf* via the PWM filter circuit 208.

The vertical blanking signal 201*v* is further shaped with a pulse shaper circuit 212. The resulting shaped signal 213 is clamped and buffered in a circuit 214 in accordance with a filtered control signal 205*pcf* to produce the drive signal 215 for the grid of the CRT.

As noted above, this circuit 200*a* has a number of disadvantages, including numerous interconnections between the integrated circuits. Accordingly, with reference to FIG. 4, another conventional system 200*b* has been used in which the output signals 227*b*, 227*g*, 227*r* from the CRT driver 226 are DC-coupled to the CRT. Further simplification is achieved by incorporating separate I2C interfaces for the control signals 201*i* within the pre-amplifier 222 and OSD generator 224 circuits. This system avoids the need for both the PWM filters 208 and the high voltage DC clamp circuit 210.

However, this circuit 200*b* has its own disadvantages. One disadvantage is limited adjustment range for bias clamp adjustment, brightness adjustment, and horizontal and vertical blanking. Additionally, the higher bias voltage required for the CRT driver 226 introduces some new problems. For example, the DC-coupled CRT driver 226 has a limited signal range and dissipates significantly higher power due to the high power supply voltage. Additionally, saturation and storage effects are worse due to the higher voltage processing required for such a high voltage circuit, thereby requiring more DC voltage headroom. Plus, since higher voltage devices are necessarily larger, they have more capacitance, thereby resulting in lower speed, more power and higher cost.

Referring to FIG. 5, another problem involves the need for multiple DC power supplies for biasing the CRT 270 correctly. Several electrodes within the CRT 270 require precise voltages and signals in order to ensure that the video information is displayed correctly on the screen.

A typical CRT monitor assembly 260 has component video signal amplifiers 262*r*, 262*b*, 262*g*, a vertical blanking amplifier 264, adjustable bias clamp circuits 266*r*, 266*b*, 266*g* for the component video signals, a high voltage bias supply circuit 268 and a CRT 270, all interconnected substantially as shown. The component video signals 261*r*, 261*b*, 261*g* are amplified by their respective amplifiers 262*r*, 262*b*, 262*g*. The resulting amplified video signals 263*r*, 263*b*, 263*g* are then AC-coupled to respective cathodes of the CRT 270. The adjustable bias clamp circuits 266*r*, 266*b*, 266*g* set the DC voltage level of the signals 267*r*, 267*b*, 267*g* driving the cathodes at the appropriate level so that a black video signal results in the appropriate cathode-to-grid potential to create a black image on the screen of the CRT 270.

Each adjustable bias clamp circuit 266*r*, 266*b*, 266*g* is powered via a common voltage supply 268, typically at a value of approximately 120 volts. This typically requires a power supply winding rectification and smoothing capacitor within the power supply 268 and, of course, connections from the power supply to the individual clamp circuits 266*r*, 266*b*, 266*g*. Such connections can create an antenna that produces radio frequency interference (RFI) due to the very high frequencies within the video amplifier circuits. To minimize this RFI, any power supply wiring connected to the video amplifiers generally require additional RFI decoupling circuits 272 at the circuit card interface, as shown.

An additional requirement in video amplifiers is a negative-going video pulse 261*v* to blank the screen during the vertical scan retrace interval. Typically, a pulse is taken from the vertical deflection stage, processed to form a bilevel pulse and used to drive an amplifier 264 which creates a rectangular pulse of approximately 30–40 volts peak-to-peak. This pulse is usually AC-coupled into the grid one of the CRT to ensure that the cathode-to-grid one potential is driven beyond cutoff (i.e., no light output) during the retrace interval. This blanking amplifier typically includes one or more transistors configured as a low power amplifier.

The vertical blanking amplifier 264 and the 120 volt power supply 268 add cost and components to the design of a CRT monitor. Accordingly, it would be desirable to somehow eliminate the needs for these functions, thereby reducing circuit components and costs.

SUMMARY OF THE INVENTION

A vertical blanking amplifier and bias clamp boost supply in accordance with the present invention uses the amplified vertical blanking signal to generate the boosted high voltage needed for powering the bias clamp circuits. A latch circuit is used to effectively lengthen the duration of the first vertical blanking pulse so as to ensure that the boosted power supply voltage is generated in the short time interval of one or two vertical scan intervals.

In accordance with one embodiment of the present invention, a vertical blanking circuit and bias clamp boost supply for amplifying a vertical blanking signal and generating a boosted DC voltage from the vertical blanking signal includes an amplifier circuit and a voltage restoration circuit, a voltage clamp circuit. The amplifier circuit provides an amplified vertical blanking signal with a peak-to-peak AC voltage magnitude in response to reception of an input vertical blanking signal. The voltage restoration circuit, coupled to the amplifier circuit, provides the amplified vertical blanking signal combined with a DC restoration voltage in response to reception of the amplified vertical blanking signal and the DC restoration voltage. The voltage clamp circuit, coupled to the amplifier circuit, provides a boosted DC voltage which is substantially equal to a sum of a DC clamp voltage and the peak-to-peak AC voltage magnitude in response to reception of the DC clamp voltage and the amplified vertical blanking signal.

In accordance with another embodiment of the present invention, an amplifier circuit for use in a vertical blanking circuit having a reduced startup time includes amplifier input and output terminals, a latching circuit, a current sinking circuit and a current sourcing circuit. The amplifier input terminal conveys an input vertical blanking signal. The amplifier output terminal conveys an amplified vertical blanking signal which includes an amplifier output current. The latching circuit, coupled between the amplifier input and output terminals: operates in set and cleared latch states in response to reception of the input vertical blanking signal and the amplified vertical blanking signal; and provides sink and source control signals in response to assertion of the input vertical blanking signal and in response to the operation in the set latch state. The current sinking circuit, coupled between the latching circuit and the amplifier output terminal, sinks the amplifier output current in response to the sink control signal and thereby provides a portion of the amplified vertical blanking signal. The current sourcing circuit, coupled between the latching circuit and the amplifier output terminal, sources the amplifier output current in response to the source control signal and thereby provides another portion of the amplified vertical blanking signal.

In accordance with still another embodiment of the present invention, a method for amplifying a vertical blanking signal and generating a boosted DC voltage from the vertical blanking signal includes the steps of:

receiving an input vertical blanking signal;

amplifying the input vertical blanking signal and thereby providing an amplified vertical blanking signal with a peak-to-peak AC voltage magnitude;

receiving a DC restoration voltage;

combining the amplified vertical blanking signal with the DC restoration voltage;

receiving a DC clamp voltage; and clamping the amplified vertical blanking signal and thereby providing a boosted DC voltage which is substantially equal to a sum of the DC clamp voltage and the peak-to-peak AC voltage magnitude.

In accordance with yet another embodiment of the present invention, a method for amplifying a vertical blanking signal within a vertical blanking circuit having a reduced startup time includes the steps of:

receiving an input vertical blanking signal; and amplifying the input vertical blanking signal and thereby providing an amplified vertical blanking signal by operating in set and cleared latch states in response to the input vertical blanking signal and the amplified vertical blanking signal, generating sink and source control signals in response to assertion of the input vertical blanking signal and in response to the operation in the set latch state, sinking the amplifier output current in response to the sink control signal and thereby generating a portion of the amplified vertical blanking signal, and sourcing the amplifier output current in response to the source control signal and thereby generating another portion of the amplified vertical blanking signal.

BRIEF DESCRIPTION OF THE DRAWINGS

FIG. 8 illustrates signal diagrams for a multiplexed video signal interface system in accordance with another embodiment of the present invention.

DETAILED DESCRIPTION OF THE INVENTION

Figure 6:
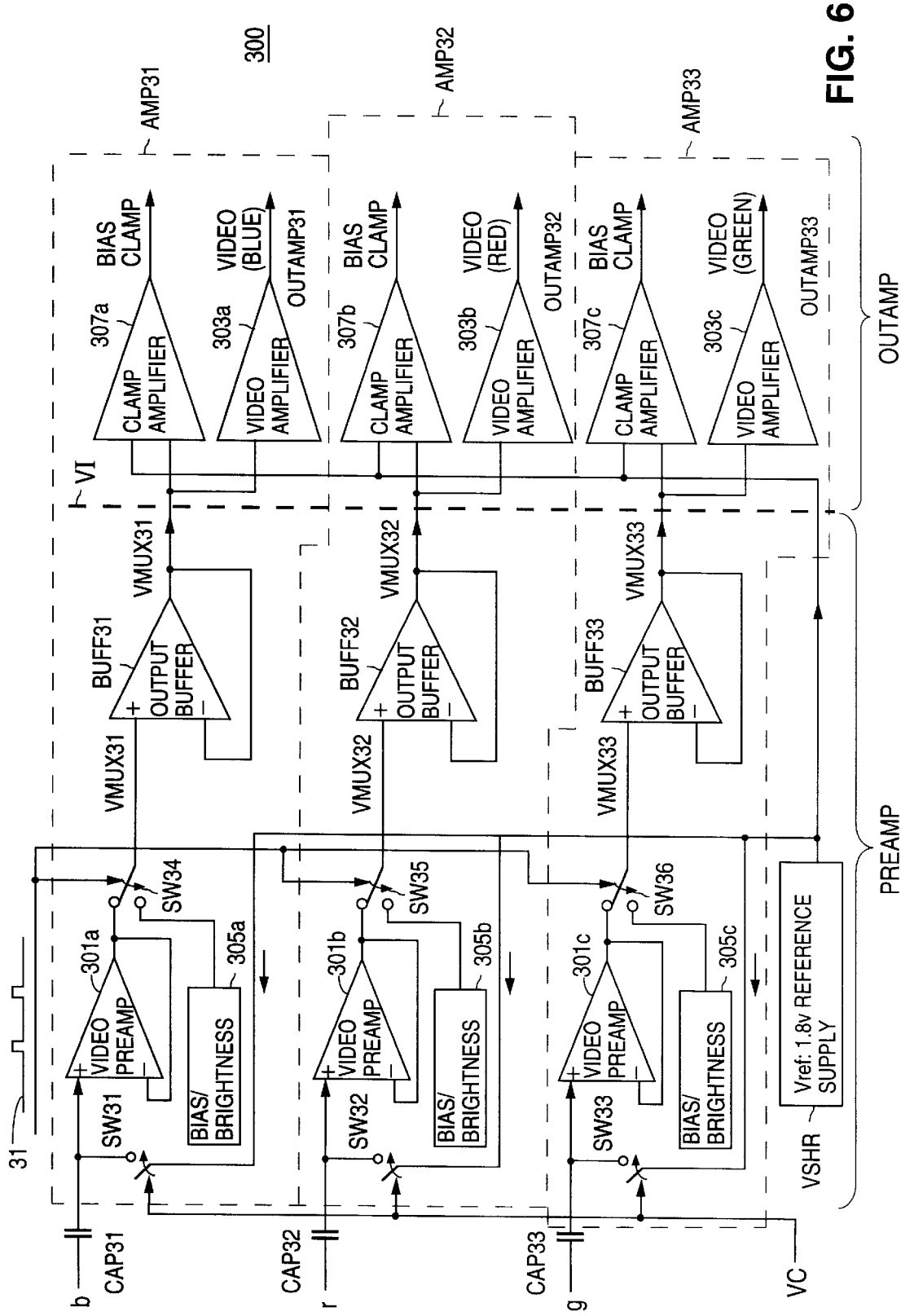
FIG. 6 is a functional block diagram of a multiplexed video signal interface system in accordance with one embodiment of the present invention.

Referring now to FIG. 6, the multiplexed video interface system 300 includes a monitor amplifier circuit AMP31–AMP33 for each video signal blue b, red r, and green g, and reduces the problems of the conventional monitor amplifier system 100. By integrating several of the components, multiplexed video interface system 300 can be constructed using only two integrated circuits (ICs)—a preamplifier circuit PREAMP and an output amplifier circuit OUTAMP. In an exemplary embodiment, preamplifier circuit PREAMP includes video preamplifiers 301a–301c and bias/brightness circuits 305–305c for each video signal blue b, red r, and green g, as well as switches SW31–SW36 and shared reference supply VSHR. It will be appreciated that although output buffers BUFF31–BUFF33 are illustrated in FIG. 6, such use of output buffers BUFF31–BUFF33 is optional. If output buffers BUFF31—BUFF33 are used, they too may be integrated into preamplifier circuit PREAMP. In another exemplary embodiment, output amplifier OUTAMP includes video amplifiers 303a–303c and clamp amplifiers 307a–307c for each video signal blue b, red r, and green g.

For exemplary purposes only video interface system 300 has been divided into amplifier circuits AMP31–AMP33. Since the amplifier circuits AMP31–AMP33 are identical in structure and operation, only the circuit operation of amplifier circuit AMP32 for the red video signal r will be discussed by referring to FIG. 7.

Figure 7:
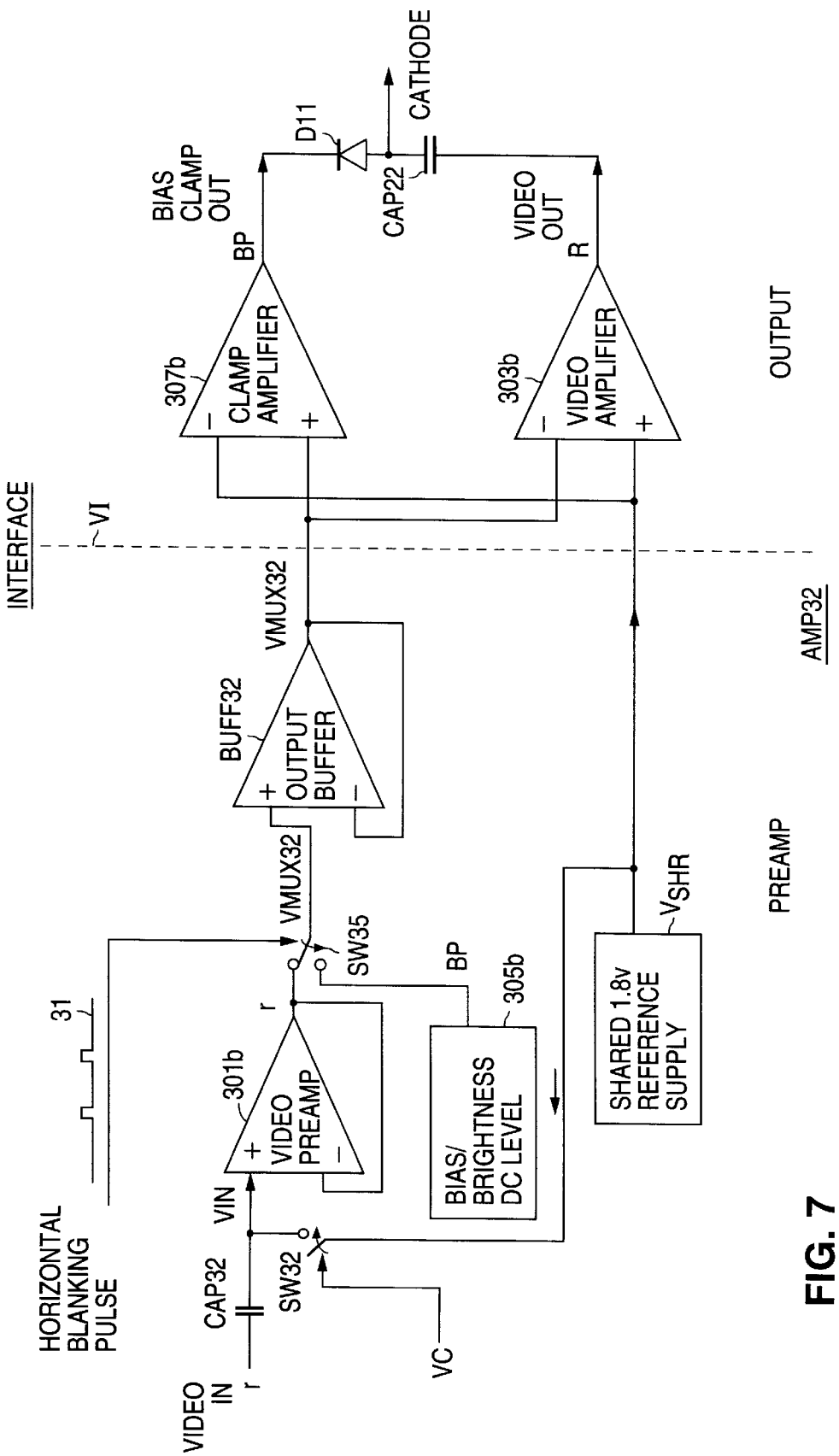
FIG. 7 is a functional block diagram of one channel of the system of FIG. 6.

As illustrated in FIG. 7, and as indicated above, amplification circuit AMP32 includes preamplifier circuit PREAMP and output amplifier circuit OUTAMP. To control the signal communication between preamplifier circuit PREAMP and output amplifier circuit OUTAMP, multiplexed video interface system 300 uses a video interface VI with a low level of complexity. Such video interface VI defines a process in which the red video signal r, output from video preamplifier 301b, and a variable direct current (DC) blank pulse BP are multiplexed into a single signal, buffered by buffer amplifier BUFF32, and sent to output amplifier OUTAMP.

The operation of multiplexed video interface system 300 illustrated in FIG. 7, is best explained in conjunction with the signal diagrams (A)–(E) illustrated in FIG. 8. Beginning with the preamplifier circuit PREAMP side of the multiplexed video interface system 300 as shown in FIG. 7, the amplification of red video signal r is controlled by a video clamp pulse VC and a single-throw switch SW32. FIG. 8(C) illustrates the clamp pulse VC, which develops just following the horizontal synchronous pulse HP, as illustrated in FIG. 8(A).

Referring again to FIG. 7, when clamp pulse VC is high, switch SW32 is closed and a shared voltage reference VSHR is coupled to the noninverting input of video preamplifier 301b and to capacitor CAP32. This shared voltage reference VSHR is the potential reference level of the black region of an image. Thus, each time the CRT scans a horizontal line, capacitor CAP32 is charged to the black level reference voltage from shared reference voltage VSHR. In an exemplary embodiment, the shared reference voltage VSHR is 1.8 volts (V). Thus, since there is no red video signal r during the time that clamp pulse VC is high, as shown in FIG. 8(B), and since video preamplifier 301b is DC coupled from input to output, an input black level voltage of 1.8V causes an output black level voltage of 1.8V. It will be appreciated that although video preamplifier 301b is illustrated as a unity gain amplifier, video preamplifier 301b may also be an increasing, decreasing or variable gain amplifier.

Figure 9:
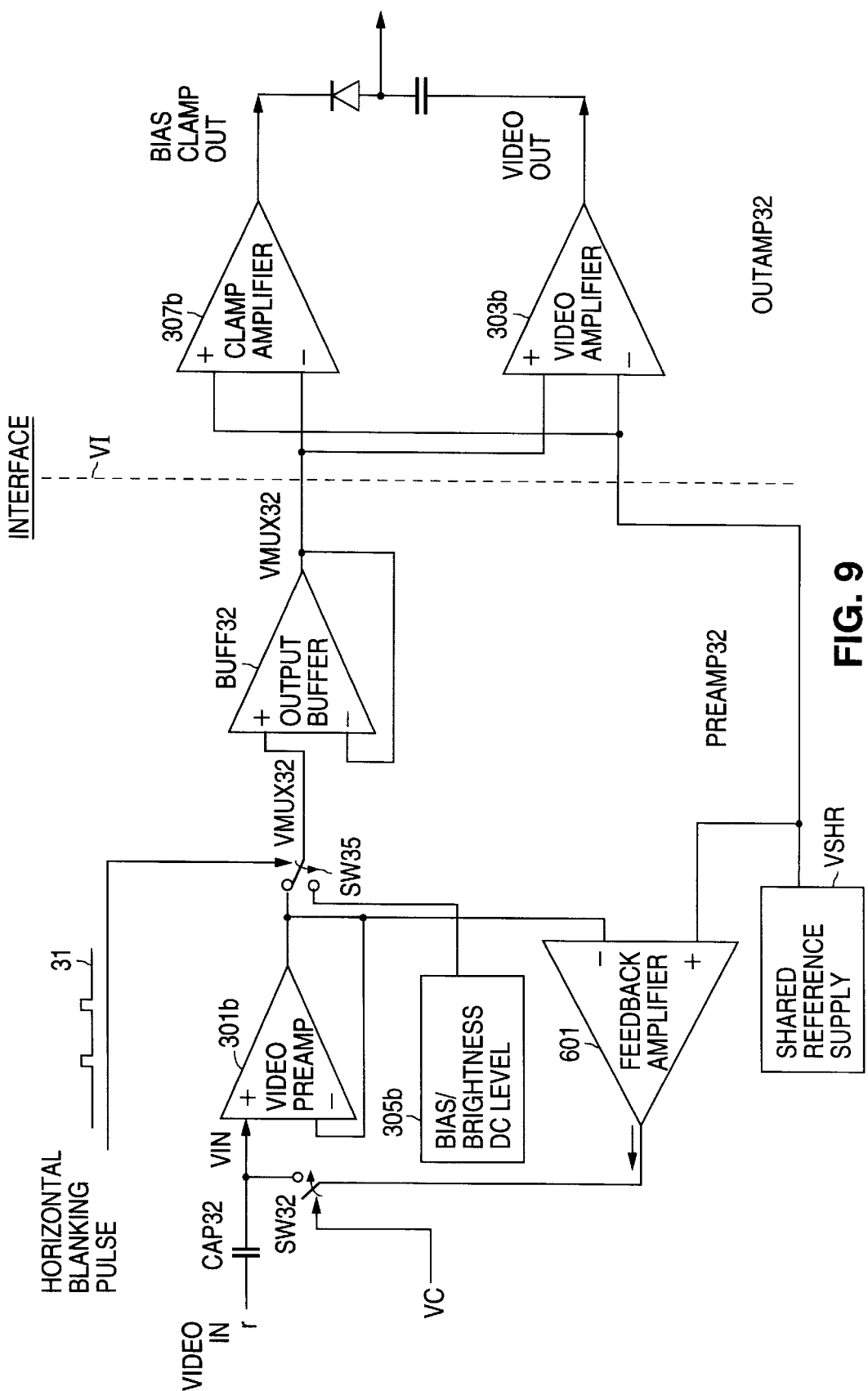
FIG. 9 is a functional block diagram of an alternative embodiment of one channel of the system of FIG. 6.

FIG. 9 illustrates an alternate embodiment of the present invention in which preamplifier circuit PREAMP includes a feedback circuit 601. This exemplary embodiment includes a feedback circuit 601 which is an operational amplifier having an inverting input coupled to the output of video preamplifier 301b, a noninverting input coupled to the shared reference supply VSHR, and an output coupled to switch SW32. In this way, feedback circuit 601, can be used within the clamp system to ensure the black level output by video preamplifier 301b during the clamp period (i.e., the period in which the clamp pulse VC signal is high) is 1.8 V in order to eliminate any DC offsets that may be present in video preamplifier 301b.

Referring now to FIG. 7 and FIG. 8(C), when video clamp pulse VC is low, switch SW32 opens and red video input signal r is applied directly to video preamplifier 301b. The red video signal r is amplified by, or passed through, the video preamplifier 301b, depending upon whether preamplifier 301b is an increasing, decreasing, unity or variable gain amplifier. In this exemplary embodiment since preamplifier 301b is a unity gain amplifier, the red output video signal is the same as the red input video signal r. This red output video signal r is then applied to one pole of a double pole switch SW35, which is controlled by a signal 31.

Signal 31, illustrated in FIG. 8(D), represents a horizontal blanking pulse which operates the double-throw switch SW35. In a conventional monitor amplifier system 100 (FIG. 1), double-throw switch SW14 was switching between the output of video preamplifier 101b and circuit ground. In contrast, double-throw switch SW35 switches between the output of video preamplifier 301b and bias/brightness circuit 305b. In this way, horizontal blanking pulse 31 controls whether the red output video signal r, illustrated in FIG. 8(B), or a variable DC blank pulse BP, is input to output buffer BUFF32. Again, it will be appreciated that the use of output buffer BUFF32 in amplifier circuit AMP32 is optional. In addition, although output buffer BUFF32 is illustrated as a unity gain amplifier, it will be appreciated that output buffer BUFF32 may also be an increasing, decreasing or variable gain amplifier.

When horizontal blanking pulse 31 is high, switch SW35 couples to the output of video preamplifier 301b to conduct the red output voltage signal r. When horizontal blanking pulse 31 is low, switch SW35 couples to bias/brightness circuit 305b to conduct variable DC blank pulse BP. Both signals, red output video signal r and variable DC blank pulse BP, are multiplexed to form a multiplexed signal VMUX32 and as illustrated in FIG. 8(E), buffered by output buffer BUFF32 and sent to output amplifier OUTAMP.

Although the processing of a single red output video signal r has been described, it will be appreciated that On Screen Display (OSD) video information may also be multiplexed with the red output video signal r information in the video preamplifier PREAMP stage. Also, video from any other alternative source, such as when two sources of video information are used, may be mixed and viewed on one screen.

Figure 10:
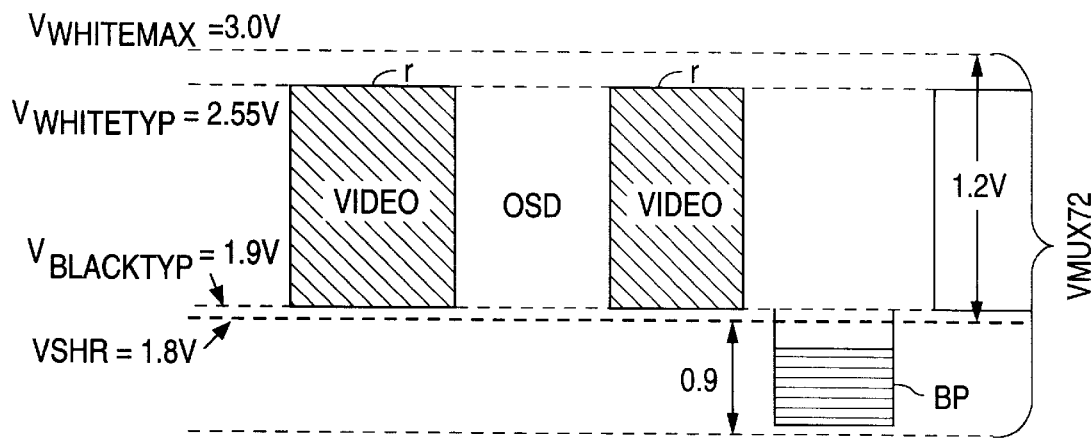
FIG. 10 is a signal diagram of a multiplexed video signal in accordance with another embodiment of the present invention.

On the output amplifier OUTAMP side of video interface VI, multiplexed signal VMUX is demultiplexed into its respective red output video signal r and variable DC blank pulse BP. This demultiplexing operation is explained in conjunction with FIG. 7, and FIG. 10 which illustrates exemplary voltage levels of a multiplexed signal VMUX72 including on screen display (OSD) data, red output video signal r data and a variable DC blank pulse BP. As illustrated in FIG. 10, in this exemplary embodiment, the shared reference voltage VSHR is 1.8V. Although the voltage level of applied red output video signal r can range from 1.8–3.0V, the typical black voltage level VBLACKTYP is between 1.8–1.9V. In addition, the typical white voltage level VWHITETYP is between 2.55–3.0V. Thus, typically red output video signal r ranges in magnitude from 1.9–2.55V. The voltage level of variable DC blank pulse BP, which is a variable amplitude signal, typically is between 0.9–1.8V. Thus, signals having voltage levels greater than 1.8 V correspond to red output video signals r, and signals having voltage levels less than 1.8 V correspond to variable DC blank pulses BP. Using this formula, output amplifier OUTAMP of FIG. 7 can properly process both red output video signals r and variable DC blank pulses BP.

Shared reference voltage VSHR, in addition to being input into video preamplifier 301b, is applied to the inverting input of video amplifier 303b and the noninverting input of clamp amplifier 307b. It will also be appreciated that, referring again to FIG. 6, shared reference voltage VSHR is input into each preamplifier 301a–301c, each inverting input of video amplifier 303a–303c, and each noninverting input of clamp amplifier 307a–307c. Referring again to FIG. 7, as indicated above, a comparison of this shared reference voltage VSHR, will determine which of the two amplifiers 303b, 307b process red output video signal r, and which of the two amplifiers 303b, 307b process variable DC blank pulse BP.

Video amplifier 303b receives multiplexed signal VMUX32 at the noninverting input and shared reference voltage VSHR at the inverting input. When the magnitude or signal level of multiplexed signal VMUX transcends shared reference voltage VSHR in a first direction, for example, is greater than shared reference voltage VSHR, which is 1.8V in this example, video amplifier 303b amplifies this signal portion of the multiplexed signal VMUX32 to provide an amplified red video signal R. When the signal level of multiplexed signal VMUX32 transcends shared reference voltage VSHR in a second direction, for example, is less than shared reference voltage VSHR, video amplifier 303b is in saturation and therefore, inactive. In this way, only red output video signal r, which is greater than 1.8V, is amplified by video amplifier 303b and sent to the CRT cathode.

In contrast, clamp amplifier 307b receives the multiplexed signal VMUX32 at the inverting input and shared reference voltage VSHR at the noninverting input. When the signal level of multiplexed signal VMUX32 transcends shared reference voltage VSHR in a first direction, for example, is greater than shared reference voltage VSHR, clamp amplifier 307b is in saturation and therefore, inactive. When the signal level of multiplexed signal VMUX32 transcends shared reference voltage VSHR in a second direction, for example, is less than shared reference voltage VSHR, clamp amplifier 307b amplifies this signal portion of the multiplexed signal VMUX32. In this way, only the variable DC blank pulse BP, which is less than 1.8V, is output from clamp amplifier 307b and sent to the CRT cathode.

Referring again to FIG. 6, each of the other amplifiers circuits AMP31 and AMP33 operate like amplifier circuit AMP32, to amplify blue video signal b and green video signal g, respectively. In particular, amplifier circuit AMP31 includes video preamplifier 301a, bias/brightness circuit 305a, video amplifier 303a, clamp amplifier 307a, and optionally buffer amplifier BUFF31. Similarly, amplifier circuit AMP33 includes video preamplifier 301c, bias/brightness circuit 305c, video amplifier 303c, clamp amplifier 307c, and optionally buffer amplifier BUFF33. In an exemplary embodiment video preamplifiers 301a, 301c and bias/brightness circuits 305a, 305c are integrated with video preamplifier 301b, 305b in preamplifier circuit PREAMP. If used, buffer amplifiers BUFF31–BUFF33 are also integrated into preamplifier circuit PREAMP. Clamp amplifiers 307a, 307c and video amplifiers 303a, 303c are integrated with clamp and video amplifiers 307b, 303b in output amplifier circuit OUTAMP.

The amplification of both the blue and green video signals b, g is controlled by video clamp pulse VC and corresponding single-throw switch SW31, SW33. Thus, when clamp pulse VC is high, switches SW31, SW33 close to charge the respective capacitor CAP31, CAP33 while the corresponding video preamplifier 301a, 301c outputs the black level voltage of shared reference voltage VSHR. On the other hand, when clamp pulse VC is low, the blue and green video signals b, g pass through the video preamplifiers 301a, 301c, respectively.

Similar to operation of amplifier circuit AMP32, horizontal blanking pulse 31 controls double-throw switches SW34 and SW36, to switch between video preamplifier 301a, 301c and bias/brightness circuit 305a, 305c. For example, the switching operation by switch SW34, causes blue video signal b to be mixed with the output from bias/brightness circuit 305a, which is a variable DC blank pulse BP, resulting in a multiplexed signal VMUX31 which is sent to output amplifier circuit OUTAMP. Similarly, the switching operation by switch SW36 causes the green video signal g to be mixed with the output signal from bias/brightness circuit 305c, which is also a variable DC blank pulse BP, forming a multiplexed signal VMUX33 which is sent to output amplifier circuit OUTAMP.

Clamp and video amplifiers 307a, 307c, 303a, 303c of output amplifier circuit OUTAMP demultiplex the multiplexed signals VMUX31, VMUX33 in the same way as clamp and video amplifiers 307b, 303b to provide the amplified video signals B, G and variable DC blank pulses to the CRT cathode.

Figure 11:
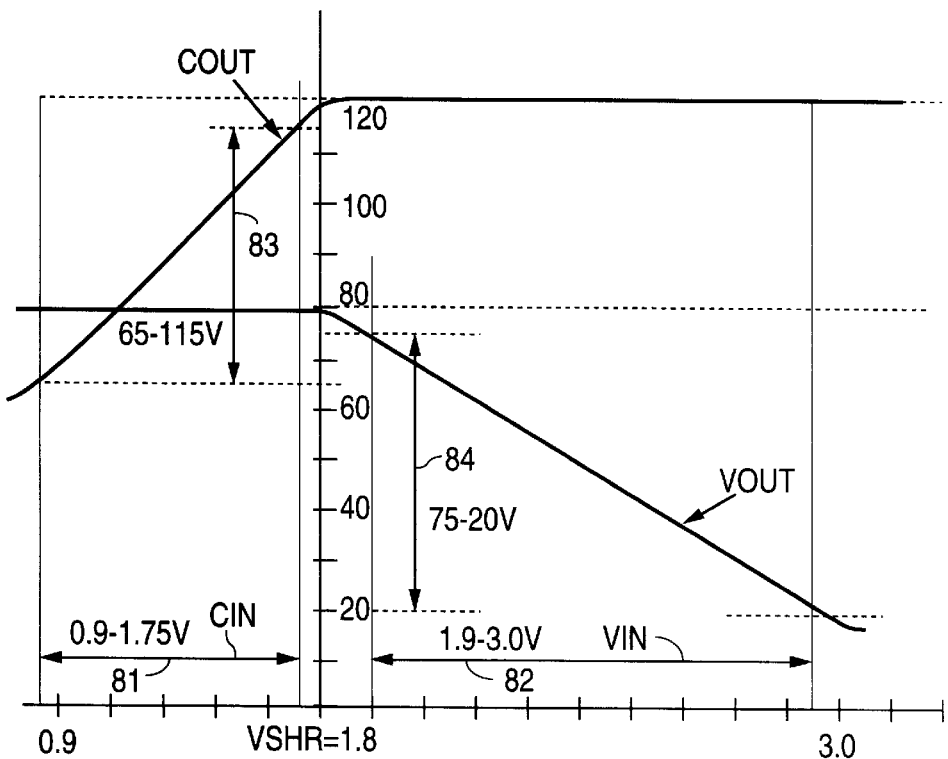
FIG. 11 is a graph of an input-to-output signal transfer characteristic for the demultiplexing portion of a multiplexed video signal interface system in accordance with another embodiment of the present invention.

Referring now to FIG. 11, an exemplary DC input/output (I/0) transfer characteristic for video and clamp amplifiers 303b, 307b is shown. In this embodiment, shared reference voltage VSHR is again 1.8V, voltage supply VCC1 for video amplifier 303b is 80V, and voltage supply VCC2 for the clamp amplifier 307b is 120V. The x-axis represents the input voltage amplitude of multiplexed signal VMUX32. The y-axis represents the output voltage of signals from video and clamp amplifiers 303b, 307b. In this example, the active clamp dynamic input range CIN for clamp amplifier 307b is 0.9–1.75V, as illustrated by double arrow 81, whereas the active dynamic video input range VIN for video amplifier 303b is 1.9–3.0V, as illustrated by double arrow 82. The active clamp dynamic output COUT range for clamp amplifier 307b is 65–115V, as illustrated by double arrow 83, whereas the active video dynamic output VOUT range for video amplifier 303b is 75–20V, as illustrated by double arrow 84.

Figure 1:
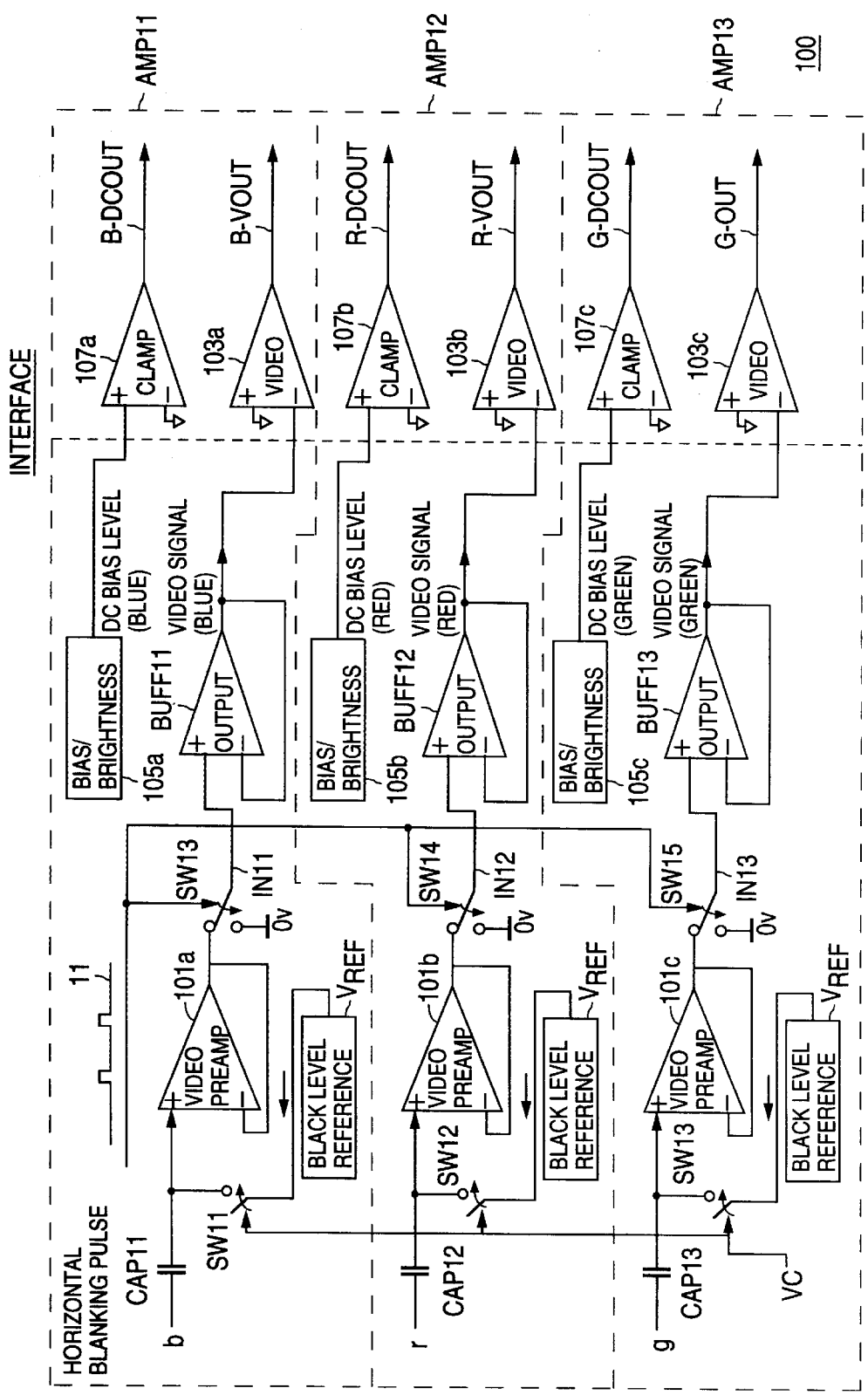
FIG. 1 is a functional block diagram of a conventional CRT driver system.
Figure 2:
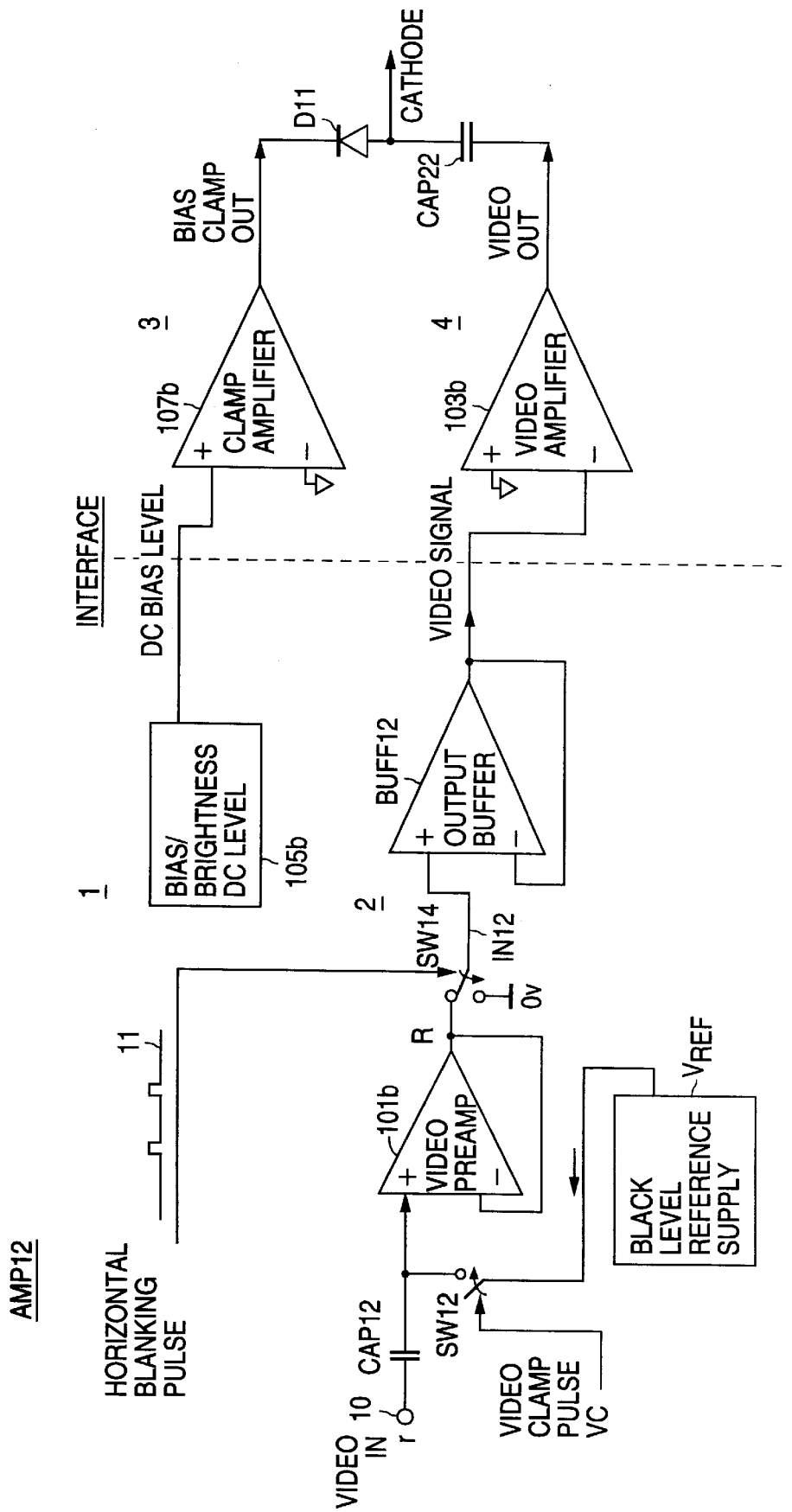
FIG. 2 is a functional block diagram of a single channel of the system of FIG. 1.
Figure 3:
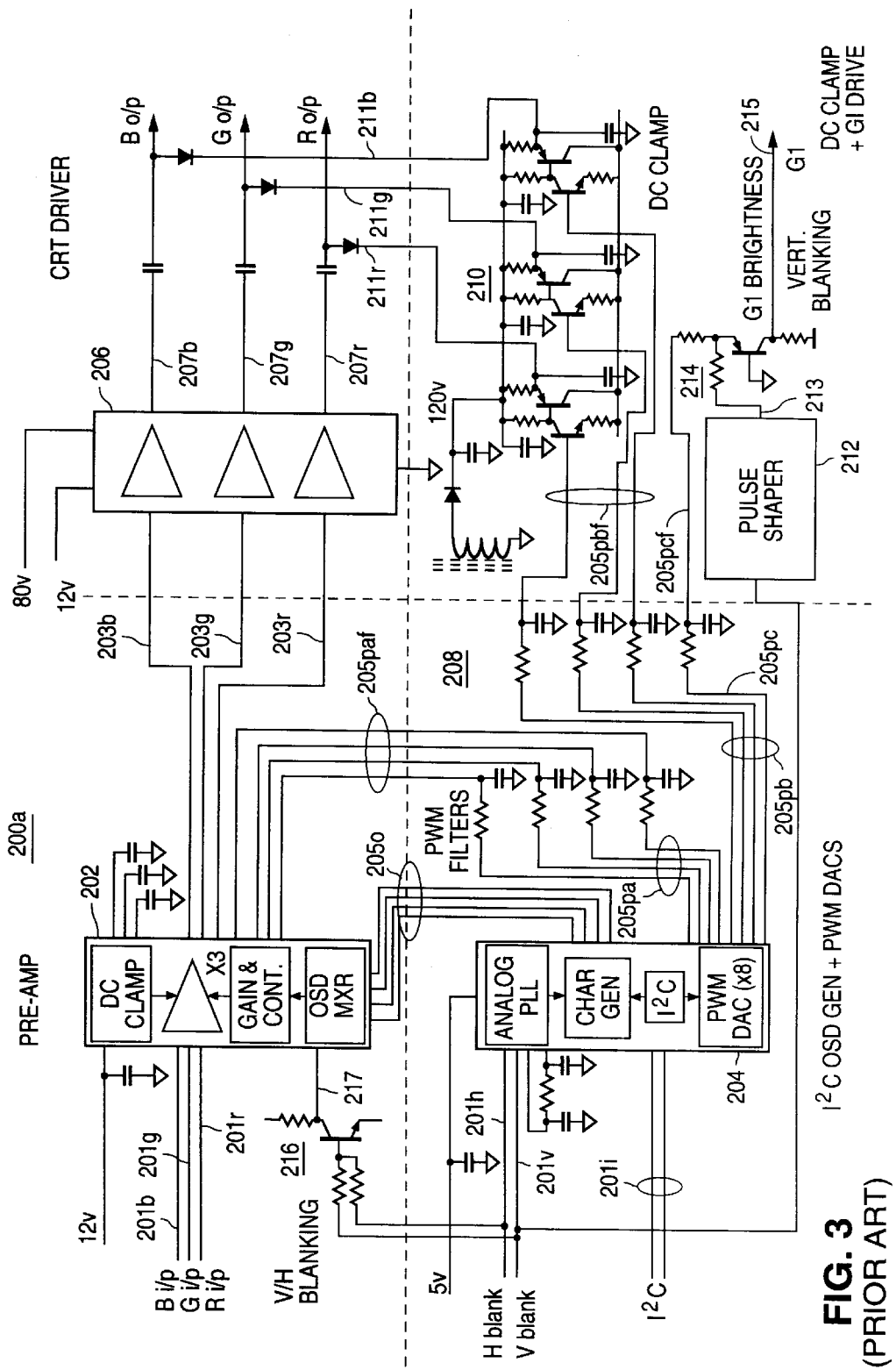
FIG. 3 is a functional block diagram of another conventional CRT driver system.
Figure 4:
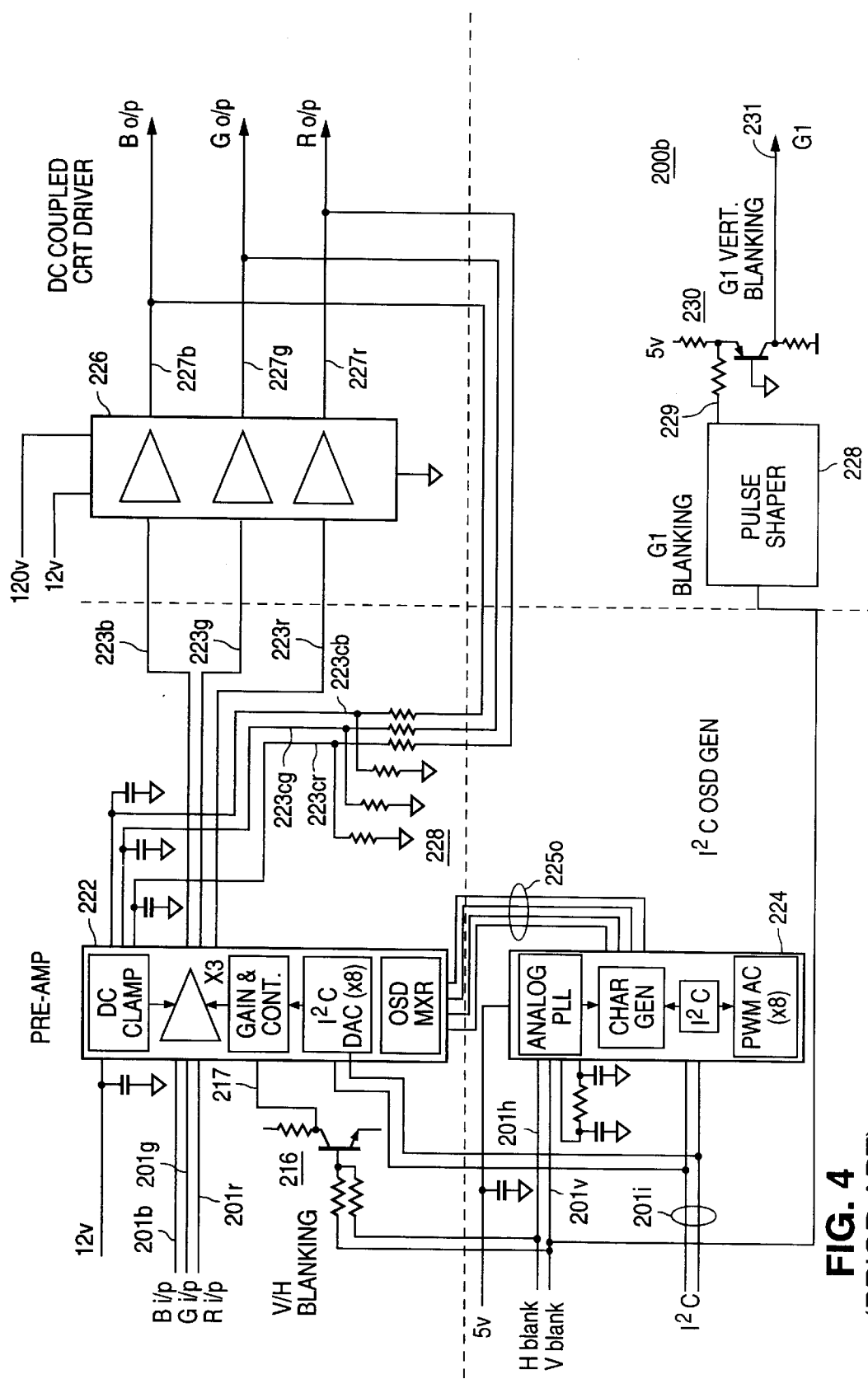
FIG. 4 is a functional block diagram of still another conventional CRT driver system.
Figure 5:
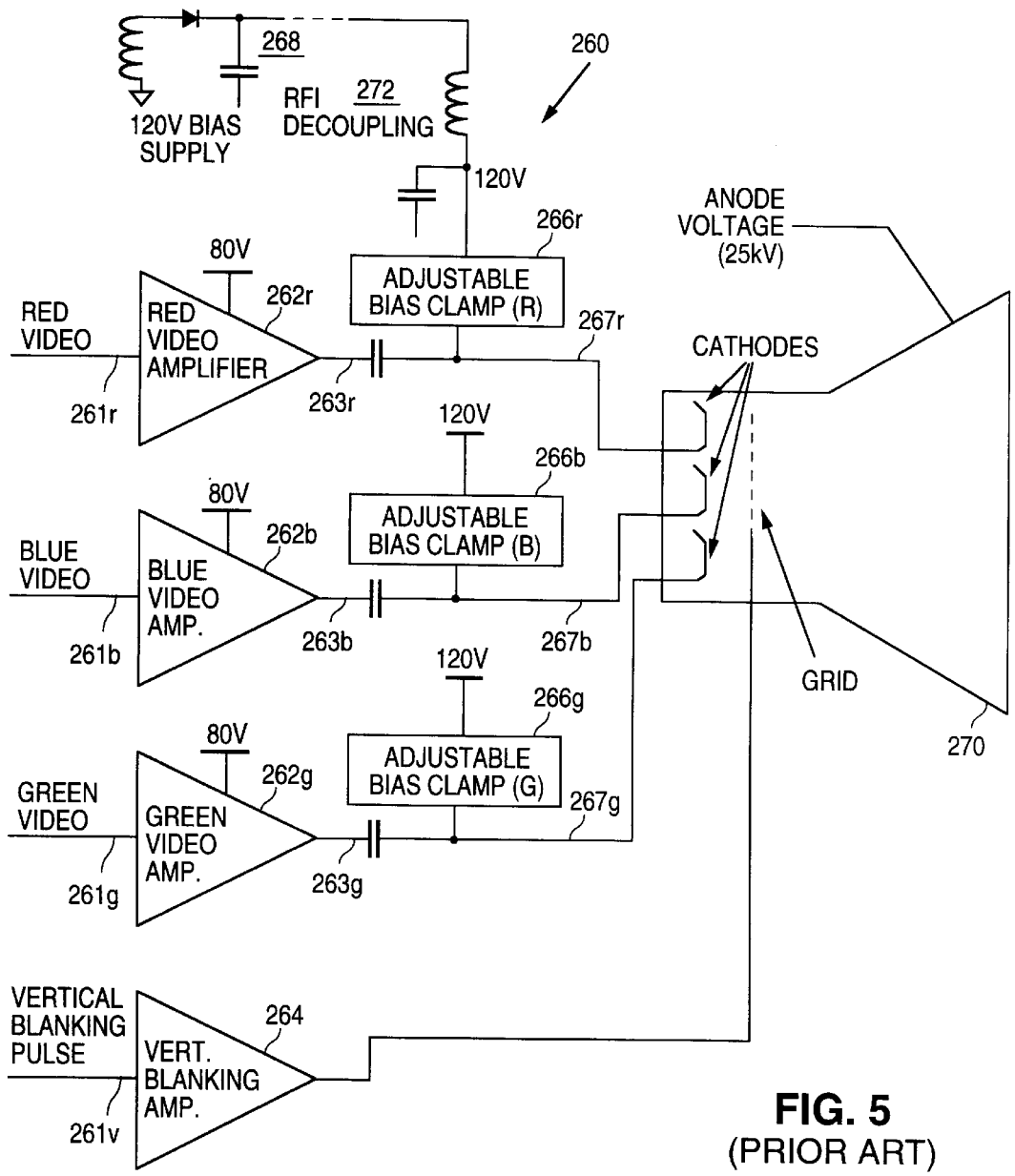
FIG. 5 is a functional block diagram of a CRT monitor assembly.

There are several advantages to the multiplexed video interface system 300 as compared to conventional monitor amplifier system 100 (FIG. 1). First, conventional low pin count packages can be used, thus reducing the cost of the video channel components. For example, the clamp video 303b and the amplifier 307b and the video driver amplifier 313a can be contained within a conventional 15 pin IC package such as the T0220 IC package. Also, preamplifier circuit PREAMP may be packaged with other functions, such as, an on-screen display generator, a digital communication bus circuit, and digitally controlled digital-to-analog converter (DAC) circuits, and still be contained in a small footprint and low cost Dual In Line (DEL) package.

Another advantage of the multiplexed video interface system 300 is the reduction in the number of required IC connections, thus reducing the size and cost of the printed circuit boards (PCB). The smaller PCB size allows for closer connection of video preamplifier 301b to video amplifier 303b, thereby improving signal performance and reducing electromagnetic interference (EMI). EMI is further reduced because the video signal interface between preamplifier 301b and video amplifier 303b is approximately 12 decibels (dB) lower.

Finally, in one embodiment, the video amplifier 303b and clamp amplifier 307b are both differential amplifiers, and thus have good common mode noise rejection. In addition, the multiplexed interference signal is referenced to a stable and accurate voltage generated in the preamplifier. Thus, common mode noise and voltage variations in the system, such as the thermal drift or production variation that may occur in any of the circuits, are minimized.

Figure 12:
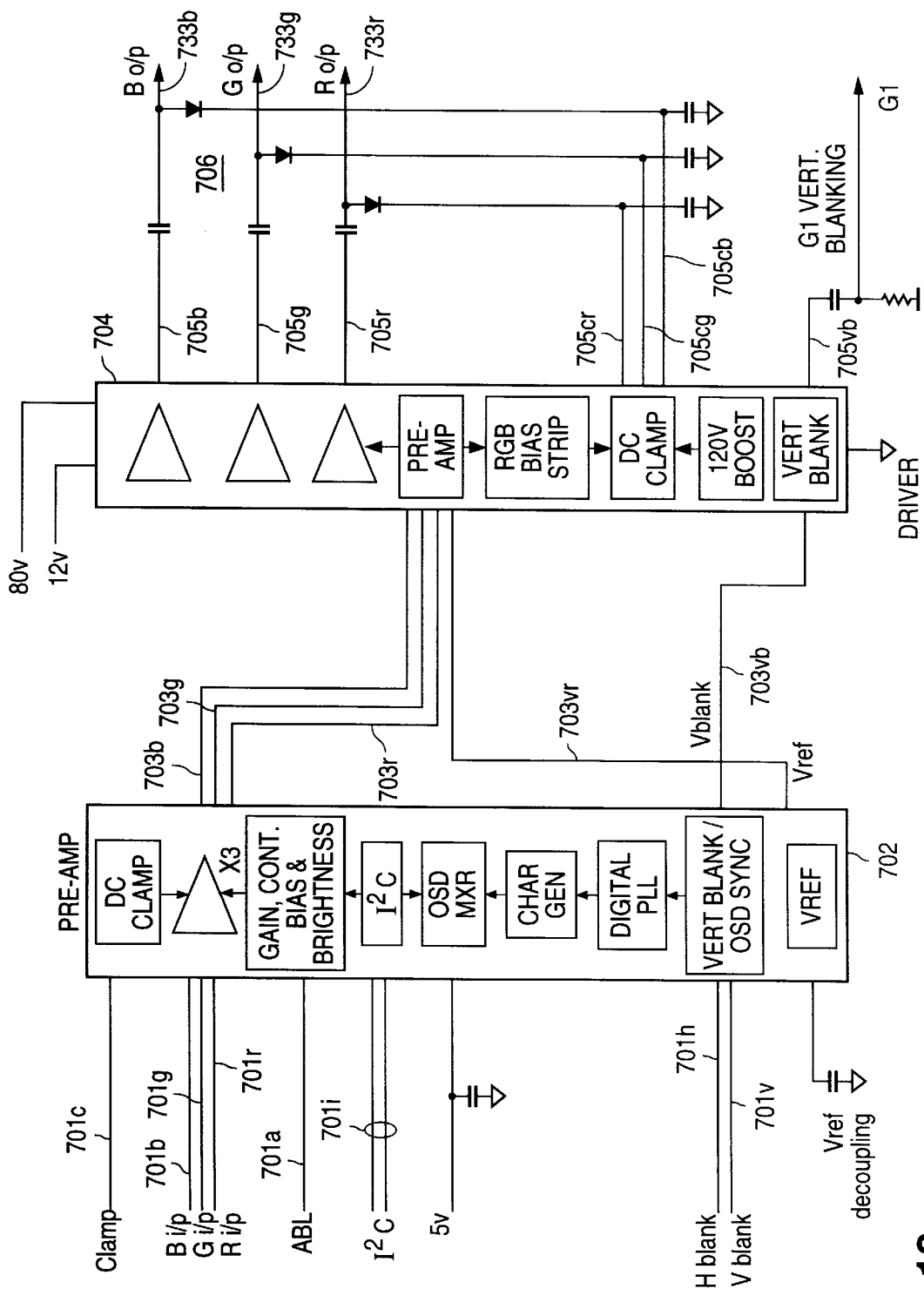
FIG. 12 is a functional block diagram of a multiplexed video signal interface system in accordance with another embodiment of the present invention.

Referring to FIG. 12, a multiplexed video signal interface system 700 in accordance with one embodiment of the present invention includes two integrated circuits: a preamplifier 702 and CRT driver 704. As inputs, the preamplifier 702 receives: the component video signals 701b, 701g, 701r; a clamp signal 701c; an automatic beam limiting control signal 701a; horizontal 701h and vertical 701v blanking signals; and digital control signals 701i in accordance with the 12C standard. As output signals, the preamplifier 702 provides: clamped and amplified component video signals 703b, 703g, 703r; a reference DC voltage 703vr; and a buffered vertical blanking signal 703vb. Internally, the pre-amplifier 702 provides for amplifying and clamping the component video signals, as well as providing for individual control of gain, contrast, bias and brightness, with bias and brightness control information being multiplexed within the output component video signals 703b, 703g, 703r. Additionally, the pre-amplifier 702 provides for OSD character generation and mixing within the outgoing component video signals 703b, 703g, 703r.

The CRT driver 704, in accordance with the reference voltage 703vr and vertical blanking signal 703vb, further amplifies the component video signals 703b, 703g, 703r. The resulting amplified video signals 705b, 705g, 705r are clamped in a simple output clamping circuit 706 using DC clamp signals 705cr, 705cg, 705cb generated within the CRT driver 704. Additionally, the CRT driver 704 provides a grid signal 705vb for driving grid one of the CRT.

Internal to the CRT driver 704, the vertical blanking signal 703vb is used to generate the necessary boosted high voltage for the DC clamping function, as well as for the amplifiers performing the demultiplexing function upon the multiplexed component video signals 703b, 703g, 703r (discussed in more detail below).

Figure 13:
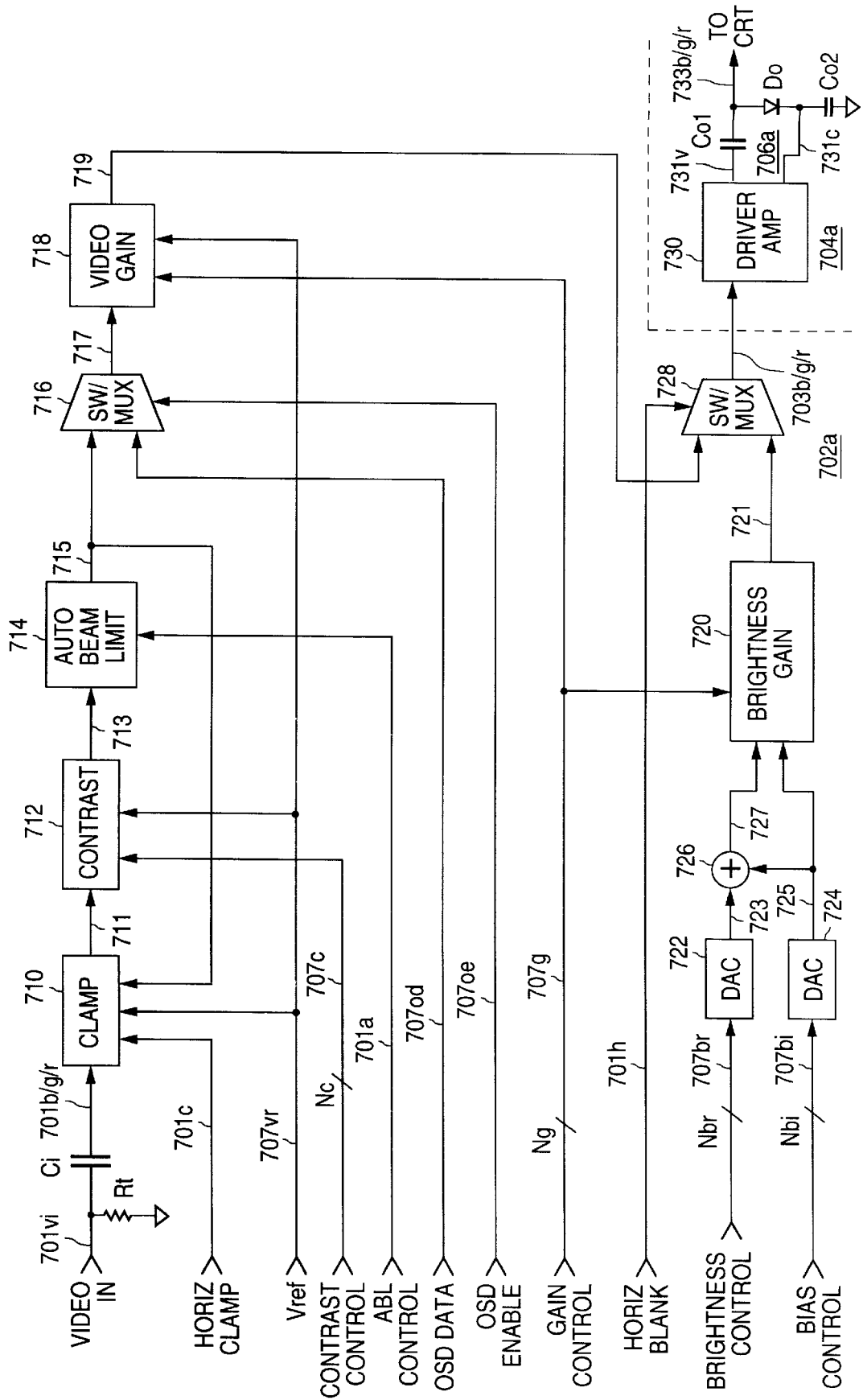
FIG. 13 is a functional block diagram for the video signal path for one channel of the circuit of FIG. 12.

Referring to FIG. 13, one video channel of the system of FIG. 12 is shown in more detail. The incoming video signal 701vi is terminated with a termination resistor Rt for impedance matching purposes and is AC-coupled with a coupling capacitor Ci. The resulting AC-coupled signal 701b/g/r is DC-clamped by a clamping circuit 710 in accordance with the reference voltage 707vr, the horizontal clamp signal 701c and a voltage level fed back from a subsequent portion of the circuit (discussed in more detail below).

The DC-clamped signal 711 is then processed by a contrast controller 712 in accordance with contrast control signals 707c and the reference voltage 707vr. This allows the user to control the contrast of the video information via the contrast control signals 707c (discussed in more detail below).

The contrast-controlled signal 713 is then processed by an auto beam limit circuit 714 (various forms of which are well known in the art) in accordance with the ABL control signal 701a.

The resulting video signal 715 is fed back to the clamp circuit 710 (discussed in more detail below) and to a switch/multiplexor circuit 716 which is used to multiplex this video signal 715 and an OSD data signal 707od in accordance with an OSD enable control signal 707oe. The output signal 717 contains OSD and video information during the time intervals that the OSD control signal 707oe is asserted and de-asserted, respectively.

The resulting video/OSD signal 717 is then controlled with respect to signal gain by a video gain controller 718 in accordance with the reference voltage 707vr and gain control signals 707g (discussed in more detail below).

The resulting signal 719, which has now been DC-clamped, controlled for video contrast, controlled for beam signal strength, combined with OSD information and controlled for video gain, is multiplexed with a signal 721 containing brightness and bias control information in a switch/multiplexor circuit 728 controlled by the horizontal blanking signal 701h.

Digital brightness 707br and bias 707bi control signals are converted to their analog equivalent signals 723, 725 by digital-to-analog converter (DAC) circuits 722, 724. These analog signals 723, 725 are summed in a signal summing circuit 726 and the resulting sum signal 727 and analog bias control signal 725 are processed in a brightness gain controller 720 in accordance with the gain control signals 707g to produce the signal 721 containing the brightness and bias control information (discussed in more detail below).

The resulting multiplexed signal 703b/g/r contains a video component with usercontrolled contrast and gain, an OSD component with user-controlled gain, a brightness control component and a CRT bias control component (discussed in more detail below.) This signal 703b/g/r is demultiplexed and amplified by the driver amplifier 730 within the corresponding channel 704a of the CRT driver 704. This produces the video 731v and clamping 731c signals, which are combined in the clamping circuit 706a, needed to produce an appropriately clamped video signal 733b/g/r for the CRT.

Figure 14:
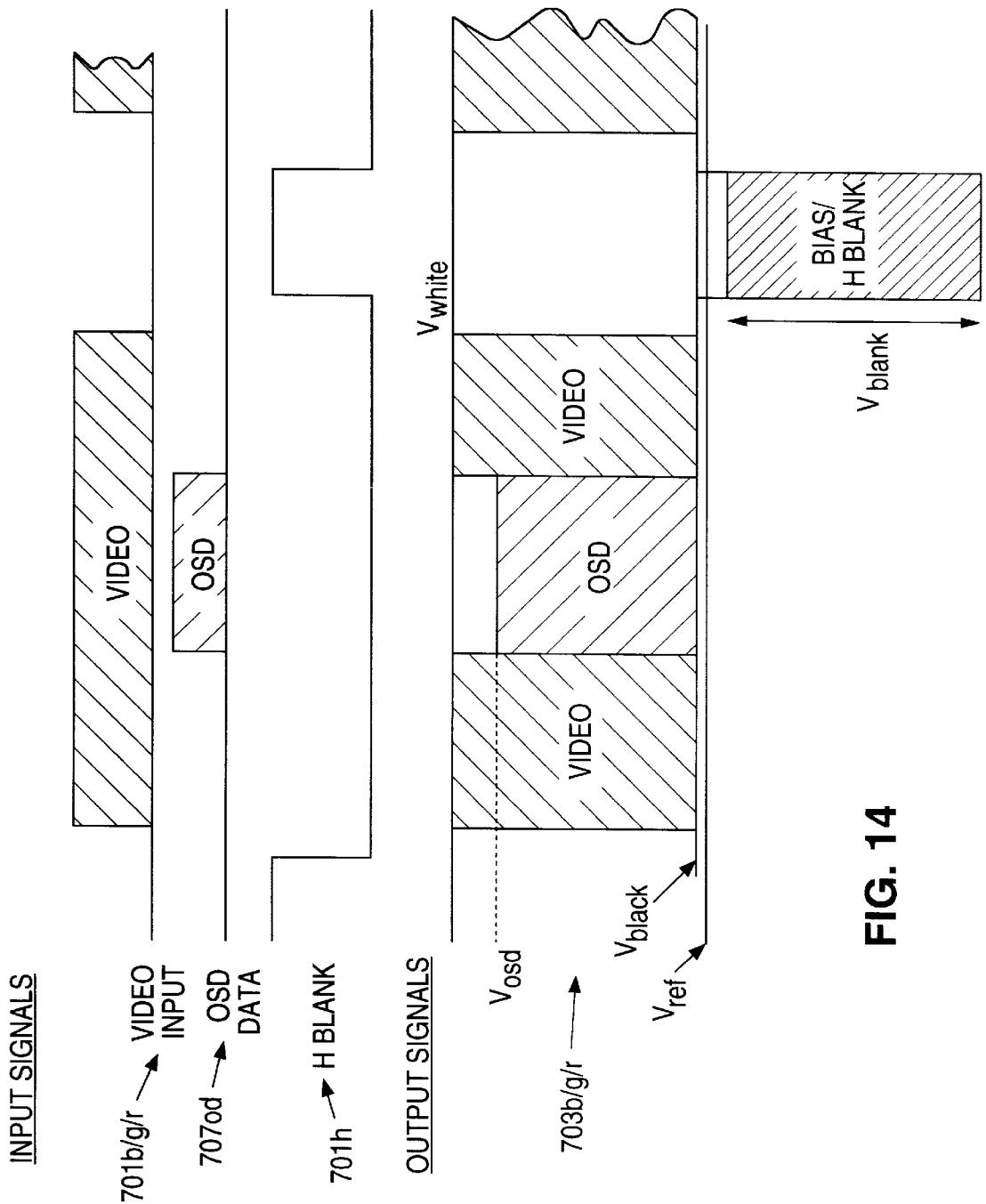
FIG. 14 is a signal diagram for representative signals of the system of FIG. 12.

Referring to FIG. 14, the multiplexing of the video input 701b/g/r and OSD data 707od during the active period of the signal can be better understood. As shown, the OSD data is inserted within the appropriate area of the video signal so as to place the OSD information in the desired position within the displayed image. During the horizontal blanking intervals, as defined by the horizontal blanking signal 701h, bias and brightness control information is provided.

Figure 15:
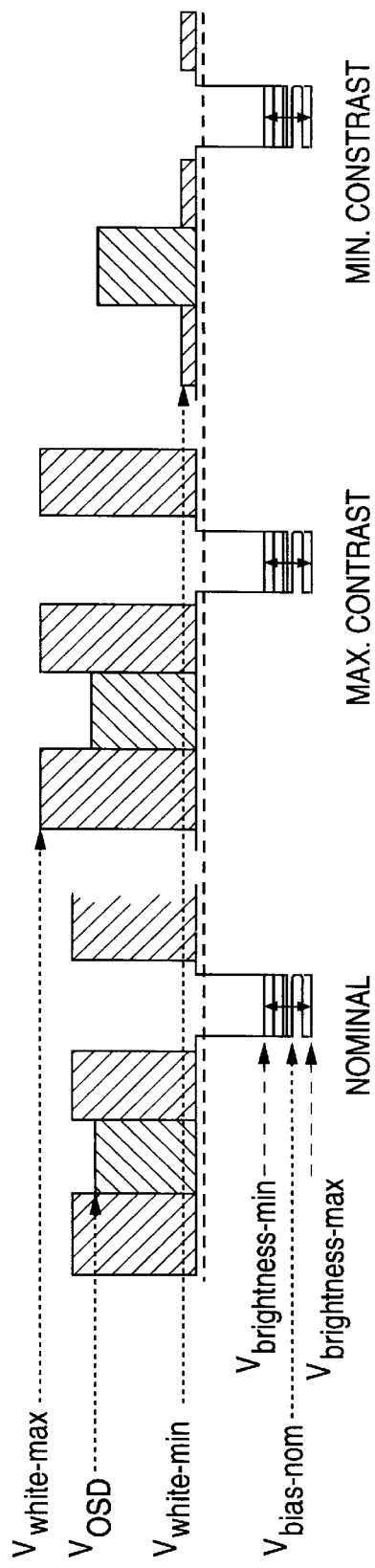
FIG. 15 is a signal diagram illustrating contrast control provided by the system of FIG. 12.

Referring to FIG. 15, the contrast control provided by the contrast controller 712 (FIG. 13) can be better understood. As shown, the contrast control information 707c provides for the full range of contrast control between maximum and minimum white levels during the active period of the video signal. Also as shown, the level of the OSD information is unaffected since it is introduced into the video signal channel at a later point.

Figure 16:
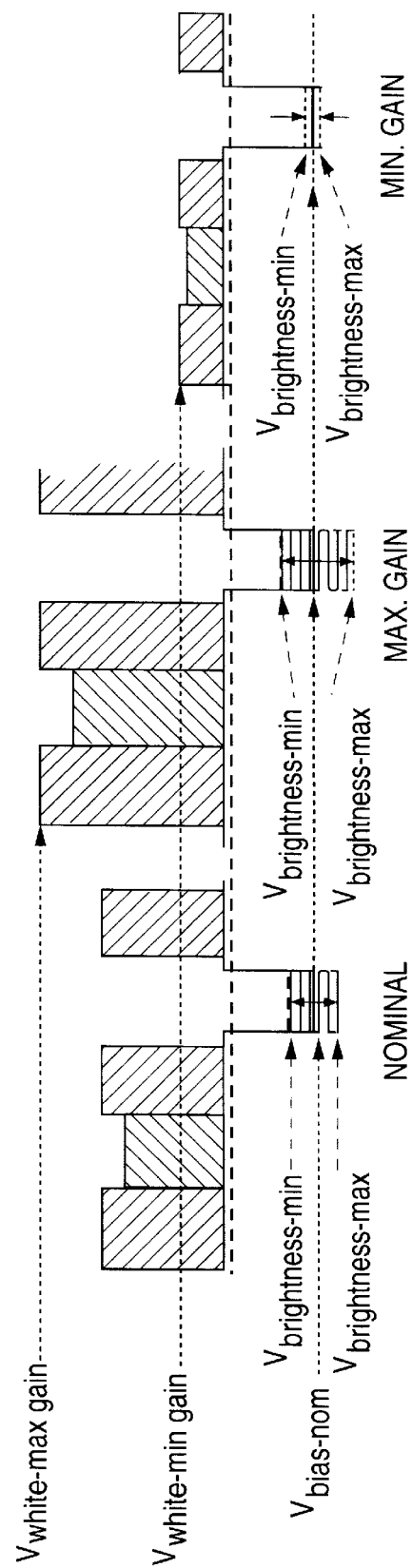
FIG. 16 is a signal diagram illustrating gain control provided by the system of FIG. 12.

Referring to FIG. 16, the gain control provided by the video gain controller 718 (FIG. 13) over the video and OSD information can be better understood. As shown, both video and OSD information are affected with full control provided between maximum and minimum white levels. Additionally, as shown, this gain control also affects the range of brightness control due to the use of the gain control signals 707g to control the brightness gain controller 720 (FIG. 13).

Figure 17:
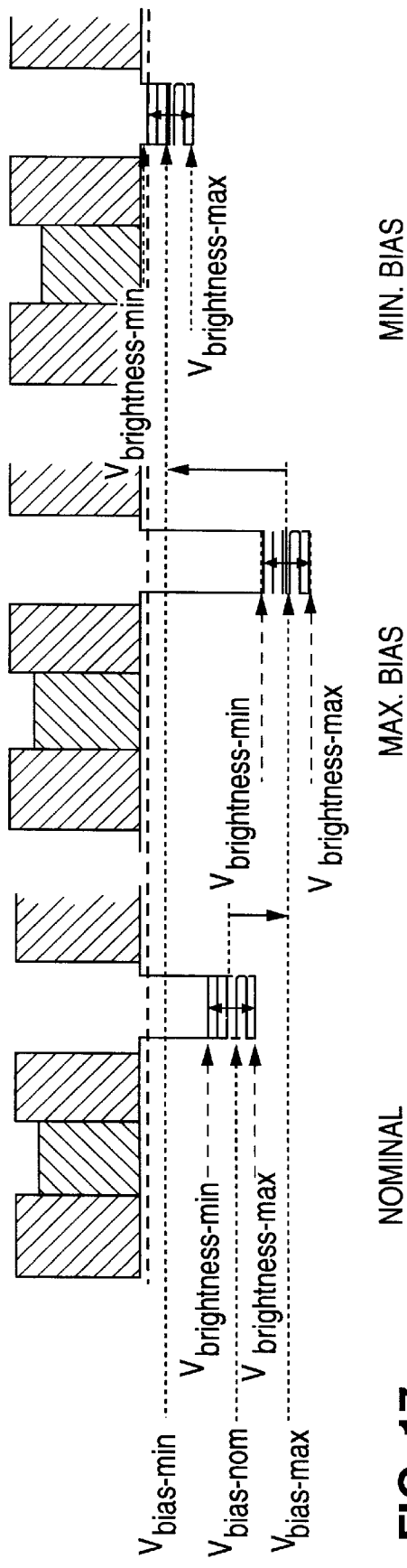
FIG. 17 is a signal diagram illustrating bias control provided by the system of FIG. 12.

Referring to FIG. 17, the bias control for controlling the bias of the CRT in accordance with the bias control information 707bi (FIG. 13) can be better understood. As shown, the bias control information 707bi sets the bias level without affecting the levels of the video, OSD or brightness components.

Figure 18:
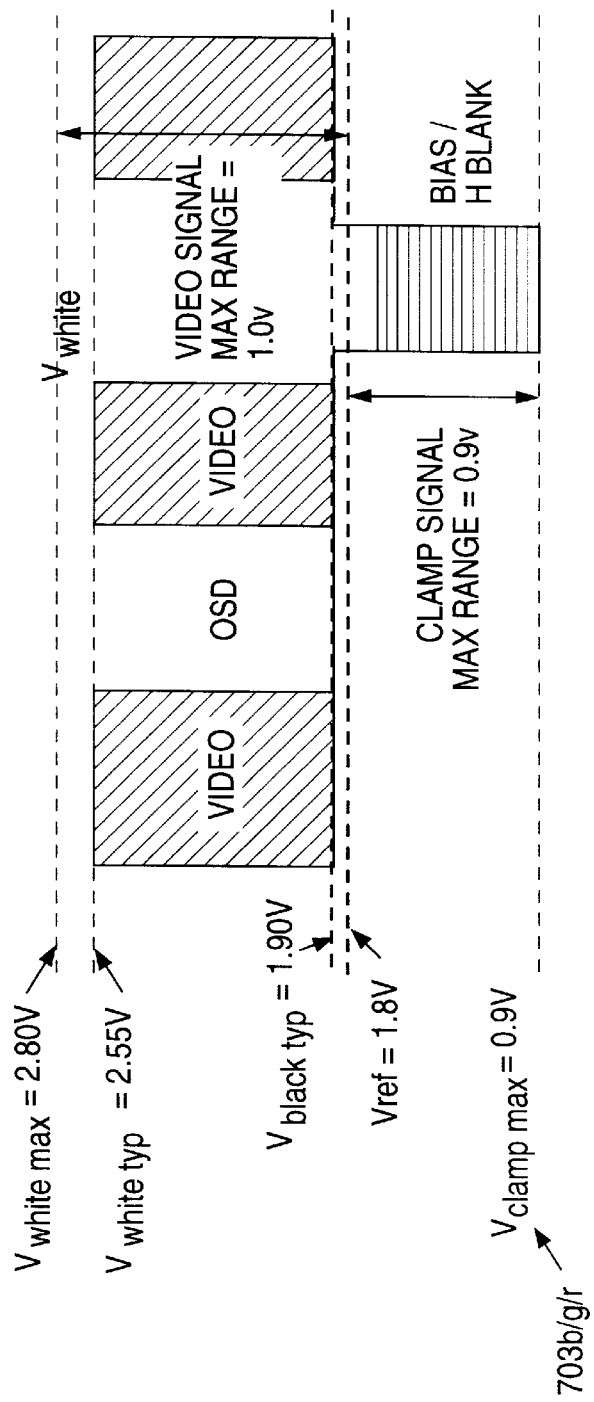
FIG. 18 is a signal diagram of a multiplexed video signal provided by the system of FIG. 12.

Referring to FIG. 18, the resulting multiplexed video signal 703b/g/r is shown with the typical voltage levels associated with the typical, minimum and maximum levels of the various components of the multiplexed signal 703b/g/r.

As will be readily appreciated, such a multiplexed video signal 703b/g/r can be conveyed via any form of signal transmission medium, such as electrical conductors or fiberoptic media, as well as via wireless signal transmission techniques, such as electromagnetic (e.g., radio frequency) or infrared signals. Further, such a multiplexed video signal 703b/g/r can be advantageously preserved for later use via recordation on any form of recording medium. For example, such a signal can be recorded in electrical memory circuits, on magnetic disk or tape, or on printed media such as an optical disc (e.g., compact disc or digital video/versatile disc).

Figure 19:
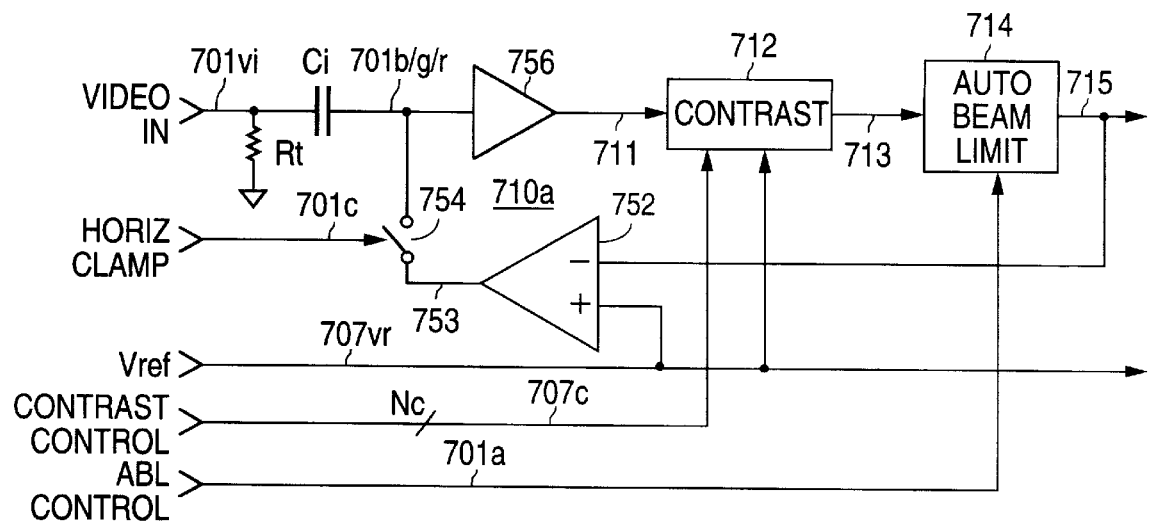
FIG. 19 is a functional block diagram of one technique used for clamping the incoming component video signal in the system of FIG. 12.

Referring to FIG. 19, a preferred implementation 710a of the clamping circuit 710 (FIG. 13) is represented. During a portion of the horizontal blanking interval, the horizontal clamp signal 701c is active and closes switch 754. This causes the DC voltage 753 from a comparator circuit 752 to be inserted into the signal path of the incoming AC-coupled video signal 701b/g/r. This DC voltage 753 is generated in accordance with the relative values of the reference voltage 707vr and the DC voltage level in the signal 715 at the output of the auto beam limit circuit 714 during the horizontal clamping time interval. The resulting DC-clamped video signal is buffered by a buffer amplifier 756 to produce the video signal 711 to be processed by the contrast controller 712 (as discussed above).

Figure 20:
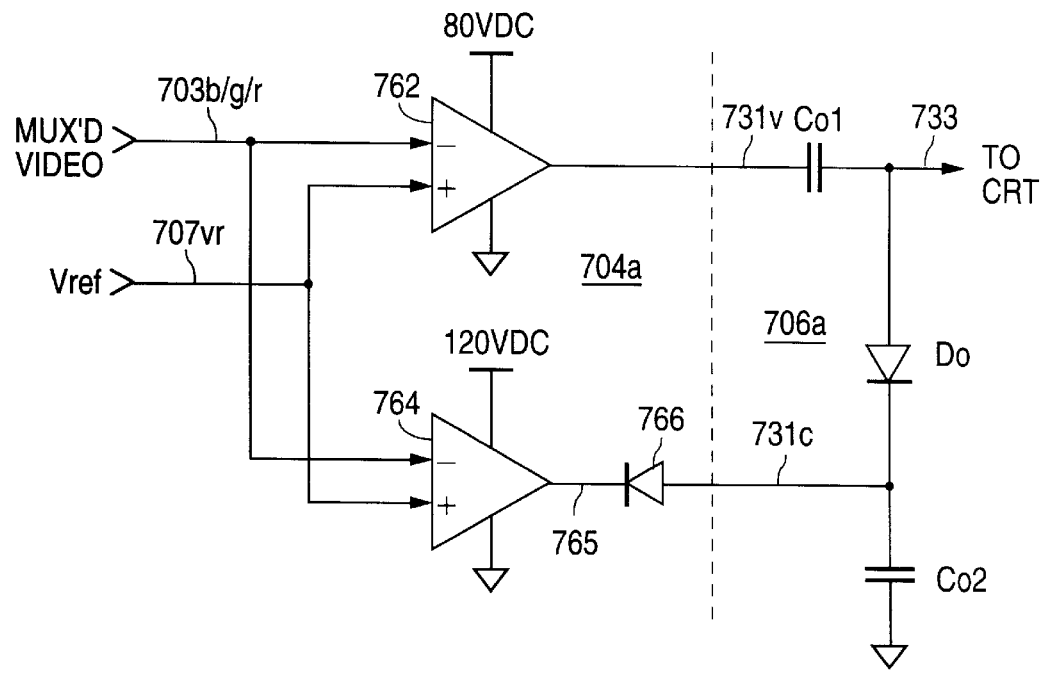
FIG. 20 is a schematic diagram of the demultiplexing portion of the system of FIG. 12.
Figure 21:
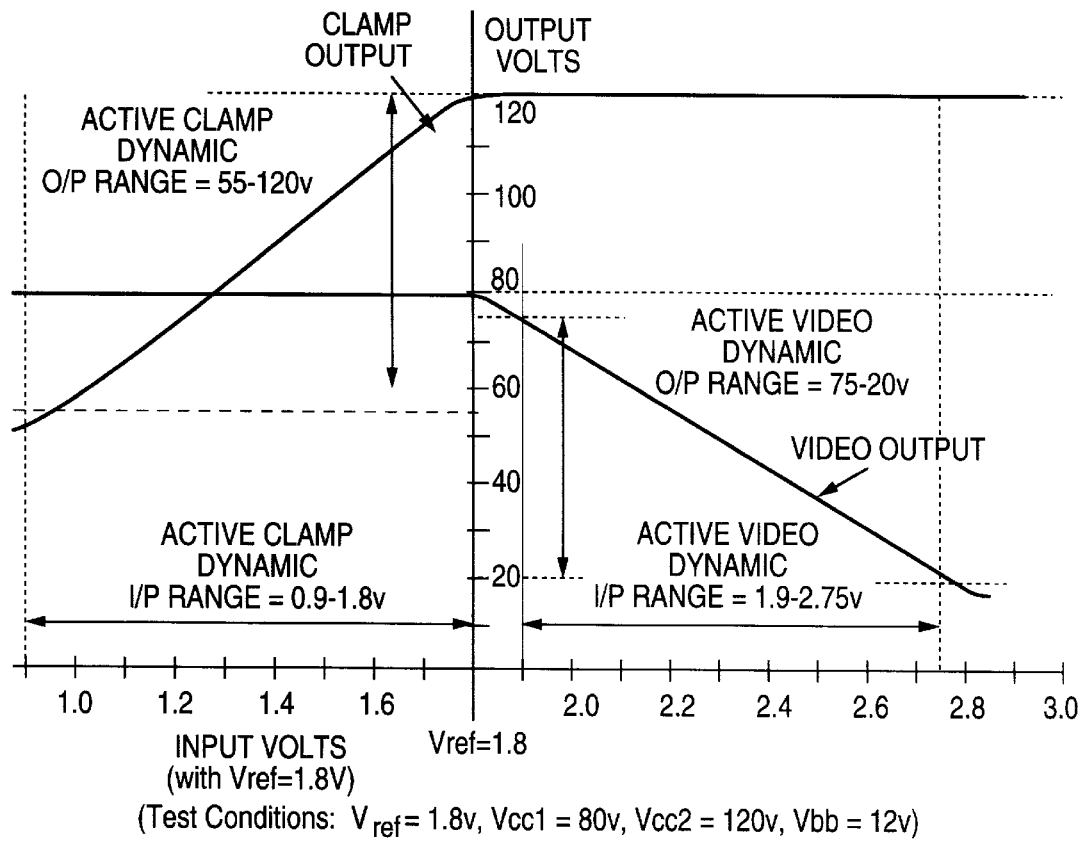
FIG. 21 is a graph of the input-to-output transfer characteristic for the circuit of FIG. 20.

Referring to FIGS. 20 and 21, the demultiplexing of the multiplexed video signal 703b/g/r within each channel 704a of the CRT driver 704 can be better understood. It is performed using two comparator circuits 762, 764. In each circuit 762, 764, the incoming multiplexed video signal 703b/g/r is compared to the DC reference voltage 707vr. The video circuit 762, biased by the 80 volt power supply potential, produces an active output video signal 731v when the multiplexed video signal 703b/g/r is more positive than the reference voltage 707vr, and produces a fixed DC level equal to the power supply potential when the multiplexed video signal 703b/g/r is more negative than the reference voltage 707vr. The clamping circuit 764, powered by a boosted high voltage source (discussed in more detail below), produces an active output clamp signal 765 when the multiplexed video signal 703b/g/r is more negative than the reference voltage 707vr, and produces a fixed output voltage equal to the boosted power supply potential when the multiplexed video signal 703b/g/r is more positive than the reference voltage 707vr. The clamp signal 765 is rectified by an output diode 766. The demultiplexed video signal 731v and rectified clamp signal 731c are then combined in the clamping circuit 706a (in accordance with well known techniques) to form an appropriately clamped video signal 733 for driving a cathode of the CRT.

Figure 22:
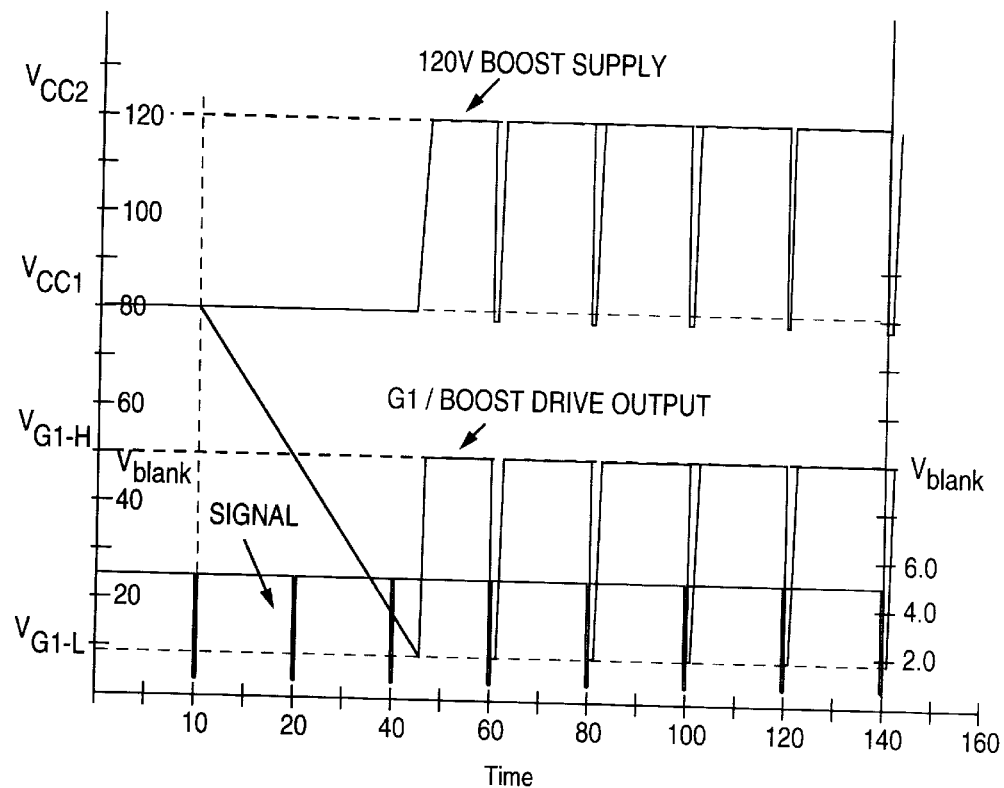
FIG. 22 is a graph illustrating the high voltage boost supply and grid blanking pulse output upon system start-up.

Referring to FIG. 22, the operation of the grid one blanking output signal 705vb (FIG. 12) in combination with the generating of the boosted power supply voltage for the clamp circuit 764 (FIG. 20) is illustrated.

Figure 23:
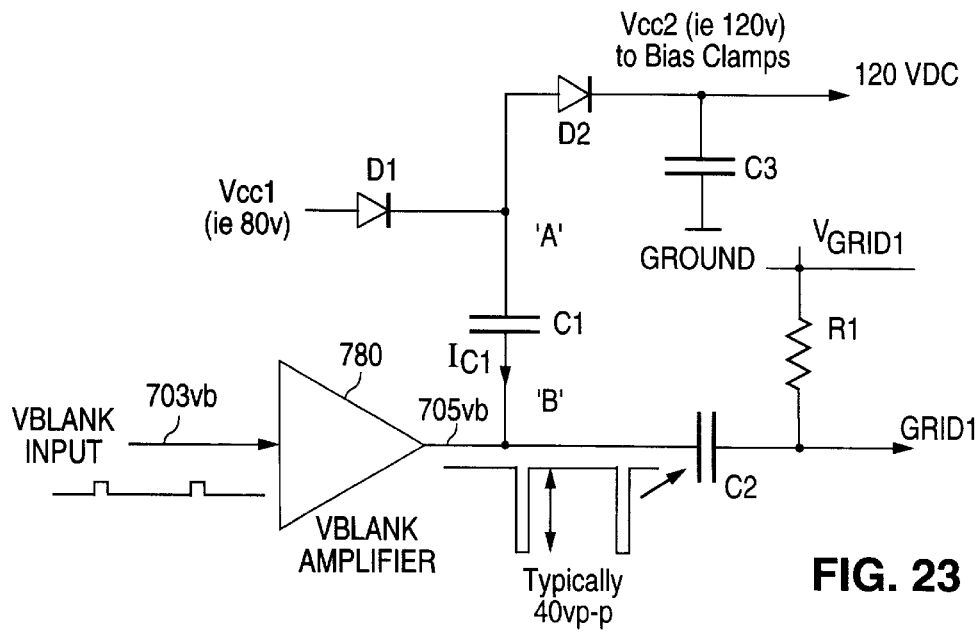
FIG. 23 is a schematic diagram of a combined high voltage boost and blanking amplifier circuit in accordance with another embodiment of the present invention.

Referring to FIG. 23, a combined high voltage boost and blanking amplifier circuit in accordance with another embodiment of the present invention uses an amplifier 780 to amplify the vertical blanking pulse 703vb. This amplified blanking pulse 705vb has a typical peak-to-peak value of 40 volts (depending upon the boosted power supply potential required). This signal pulse 705vb is AC-coupled via capacitor C2 and connected to grid one of the CRT to provide the vertical blanking. The DC level of the voltage at grid one is restored through a resistor R1 connected to the DC power supply for grid one.

This output pulse 705vb (at node B) is also AC-coupled by capacitor C1 (to node A). Diode D1 clamps the lower portion of this pulse to just below the Vcc1 power supply potential (typically 80 volts) when the output pulse 705vb is in its low voltage state and causes capacitor C1 to become charged. When the amplifier 780 drives the pulse 705vb to its high voltage state, diode D2 is conductive and causes charge from capacitor C1 to be transferred to capacitor C3, thereby creating a power supply equal to the Vcc1 supply plus the amplitude of the blanking pulse (typically 80+40= 120 volts).

Capacitor C3 (shunt connected to circuit ground) is optional and can be small in value due to the short duty cycle of the vertical blanking interval. Alternatively, the bias clamp circuits can simply use the voltage supplied directly via diode D2 from capacitor C1, provided that the bias clamp circuits are designed to be inactive during the vertical blanking interval (and thus not requiring any boosted power supply during the vertical blanking interval).

Since the vertical blanking pulse 705vb has a short duty cycle, it is necessary that capacitor C1 store sufficient charge to supply the bias clamp circuits, thereby requiring capacitor C1 to be relatively large in value and, as a result, requiring high initial charging currents. To prevent damage during initial application of power, when capacitor C1 may not yet be charged, the output of the vertical blanking amplifier 780 must be current limited to a range defined by a maximum (e.g., positive) current value Imax and a minimum (e.g., negative) value of current Imin.

Figure 24:
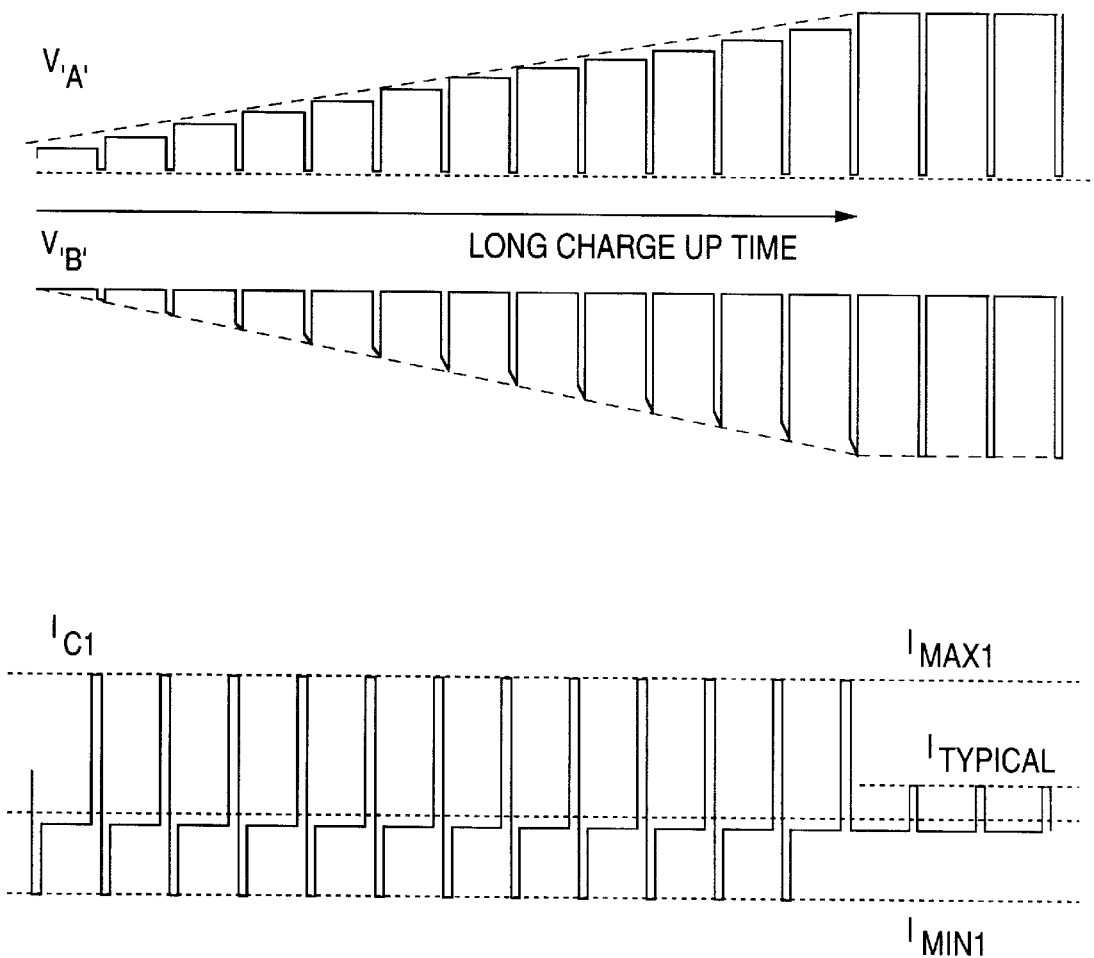
FIG. 24 is a signal diagram illustrating the start-up waveforms for the circuit of FIG. 23.

While this circuit implementation may be satisfactory in many instances, one disadvantage is that capacitor C1 may require many cycles to charge to its full value due to the short duty cycle of the vertical blanking pulse 705vb and the limited current output of the amplifier 780. Referring to FIG. 24, this may cause an undesirable delay in achieving the full boosted power supply voltage required by the bias clamp amplifiers.

Figure 25:
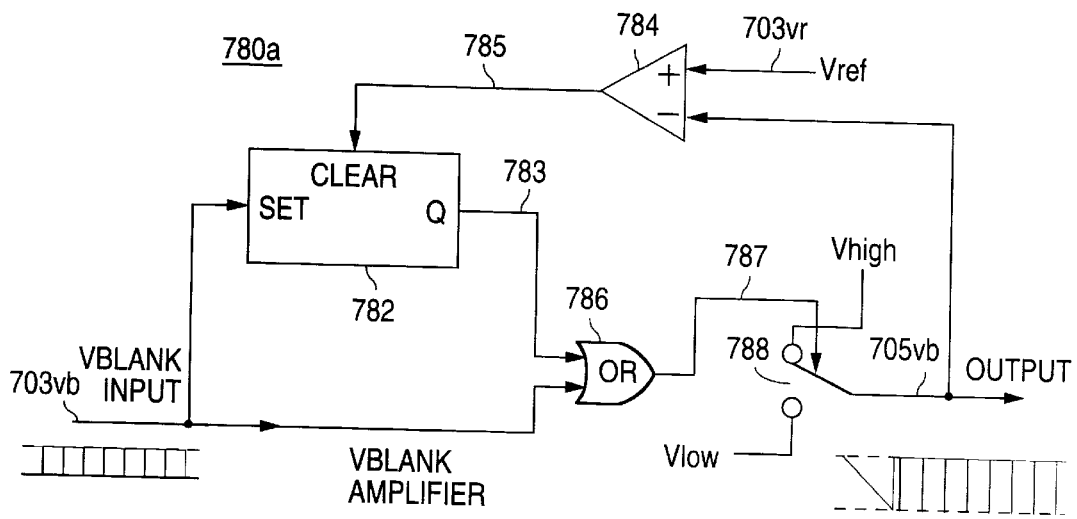
FIG. 25 is a functional block diagram of a combined high voltage boost and vertical blanking amplifier in accordance with another embodiment of the present invention.

Referring to FIG. 25, such undesirable start-up delays may be overcome using a vertical blanking circuit 780a in accordance with that shown. When the first vertical blanking input pulse 703vb is encountered at start-up, a latch circuit 782 holds the output 705vb low, thereby causing capacitor C1 to be discharged at the maximum current limit at Imax until the output drops below the low level threshold. At this point, the latch 782 is cleared. Normally, if the input 703vb has changed to the unblanked level, the output 705vb is then released, immediately causing capacitor C3 to become charged and thus producing the boosted power supply for the bias clamp circuits.

More specifically, a positive-going vertical blanking input pulse 703vb simultaneously sets the latch 782 and drives one input to an OR gate 786. The other input to the OR gate 786 is provided by the Q output of the latch 782. The output 787 of the OR gate 786 drives a switch 788 which switches the output of the amplifier 780 to a predetermined low voltage level Vlow.

This output voltage 705vb is also connected to the input of a comparator circuit 784. As long as the input signal 703vb is high, then the switch 788 is connected to the low voltage Vlow. If the input signal 703vb goes low and the output 783 of the latch 782 is also low, then the switch 788 connects to a high voltage level Vhigh, thereby driving the output signal 705vb to a high voltage level Vhigh. However, if the output voltage 705vb has not dropped below the reference voltage 703vr before the input signal 703vb has gone low, then the output 783 of the latch 782 holds the switch 788 in the Vlow position until the output 705vb does drop below the reference voltage 703vr. At that point, the latch 782 is reset and the switch 788 is switched to the high voltage position Vhigh. (As a practical matter, the reference voltage 703vr is generally only slightly higher than the low voltage potential Vlow, thereby ensuring that the latch 782 is only reset when practically the full swing of the voltage has been achieved at the output 705vb.)

Figure 26:
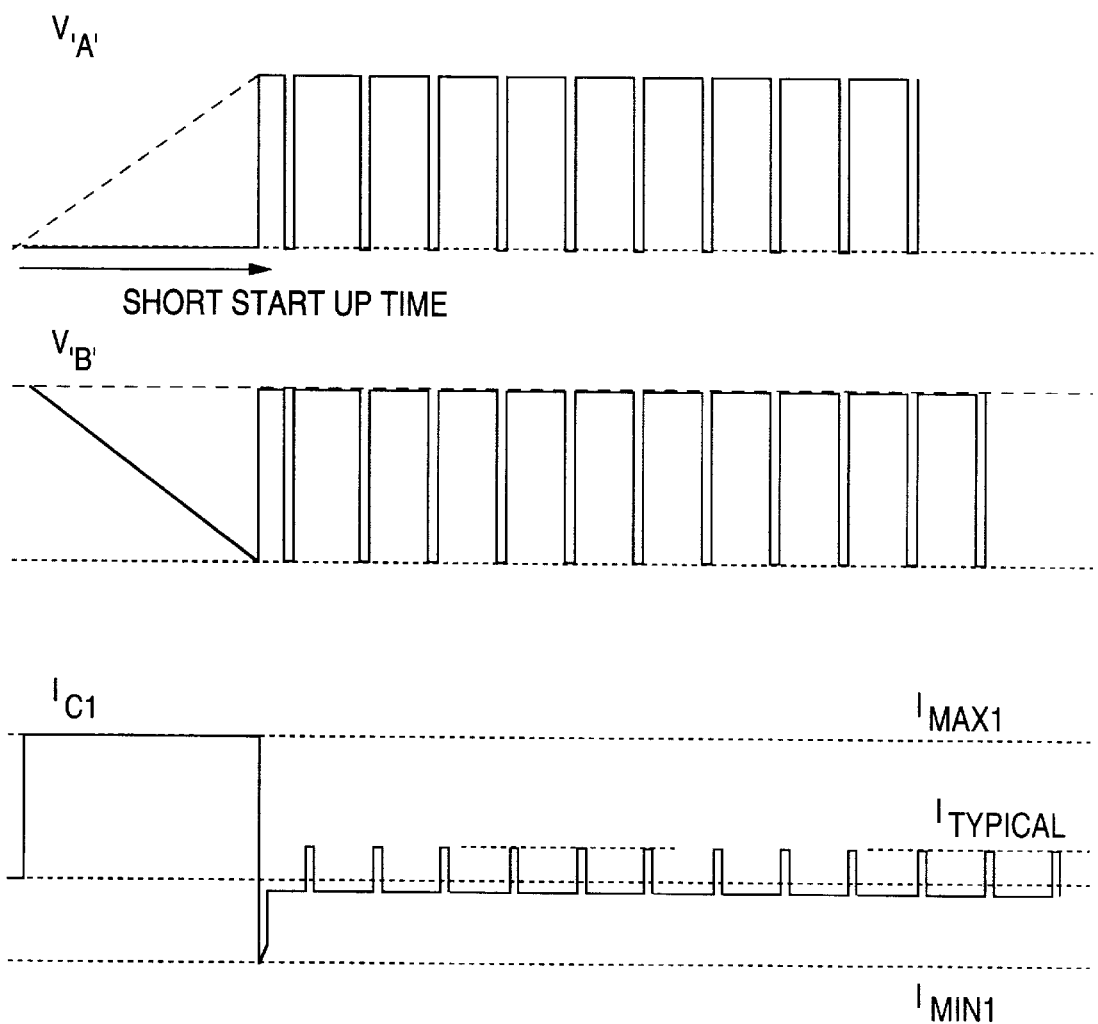
FIG. 26 is a signal diagram illustrating the start-up waveforms for the circuit of FIG. 25.

Referring to FIG. 26, it can be seen that the boost capacitor C3 is charged quickly after the first vertical blanking pulse 703vb is received. This ensures that the boosted power supply potential (120 volts DC) is created in a very short time of one or two vertical scan intervals.

Figure 27:
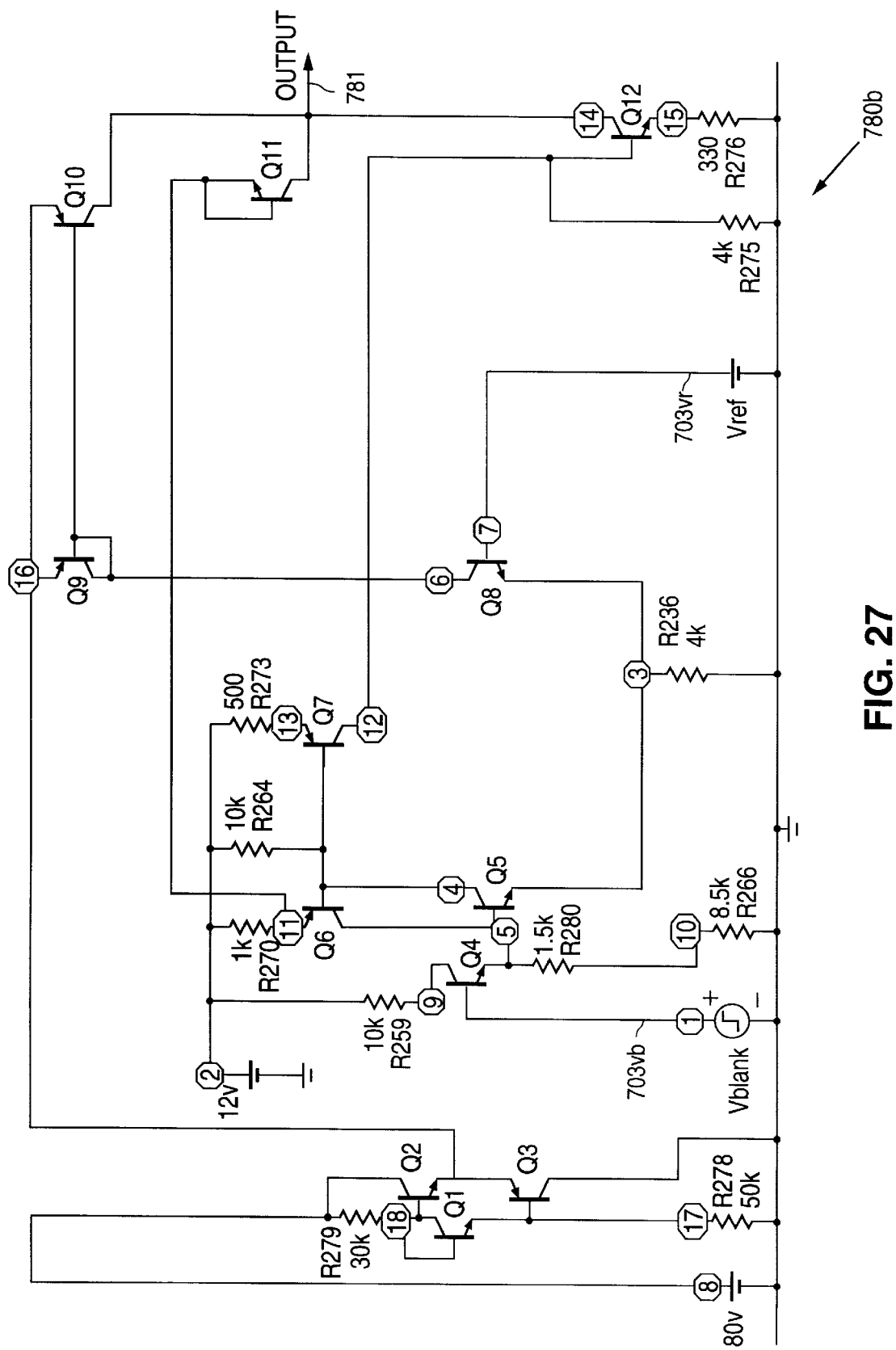
FIG. 27 is a schematic diagram of one embodiment of an actual circuit implementation of the circuit of FIG. 25.

Referring to FIG. 27, one implementation 780b of the circuit of FIG. 25 is shown in more detail and operates substantially as follows. Transistors Q1, Q2, and Q3 provide an intermediate power supply (approximately 45 volts) to set the high level of the output pulse. The input pulse 703vb drives the base of transistor Q4. Transistors Q5 and Q6 form a latching circuit. When the input pulse 703vb goes high and the output is in a high voltage state, transistors Q5 and Q6 latch to pull the base of transistor Q5 high, thereby ensuring that transistor Q5 remains turned on regardless of subsequent changes in the level of the input pulse 703vb.

When transistor Q5 is turned on, transistor Q7 is also turned on. In turn, this causes transistor Q12 to be turned on. Also, with transistor Q5 turned on, transistor Q8 is turned off, thereby turning off transistor Q10 through the current mirror action of transistor Q9.

With transistor Q7 turned on, transistor Q12 acts like a constant current source, thereby discharging the output node 781. Eventually, the output voltage drops in value so that the base-collector junction of transistor Q11 is forward biased. As the output voltage drops further, the emitter of transistor Q6 is pulled down, thereby clearing the latch formed by transistors Q5 and Q6. If the input pulse 703vb is in a high voltage state, then transistor Q5 remains on due to the base drive provided by transistor Q4. In that case, the output reaches its lower voltage level set by the current limit within transistor Q12 and the voltage developed by the current flowing through transistor Q11 and resistor R270. If the input voltage 703vb is low when the latch is cleared, then transistor Q5 turns off and, in turn, transistor Q12 turns off. Transistor Q8 is now turned on and the collector current of transistor Q8 is mirrored by transistor Q9 and amplified by transistor Q10 to provide the current limited pull-up drive to pull the output node 781 to a high voltage level.

Control circuits suitable for use as the contrast controller 712, video gain controller 718 and brightness gain controller 720 are disclosed in U.S. patent application Ser. No. 09/348, 533, filed Jul. 7, 1999, and entitled "Digitally Controlled Signal Magnitude Control Circuit" (incorporated herein by reference), as follows.

Figure 28:
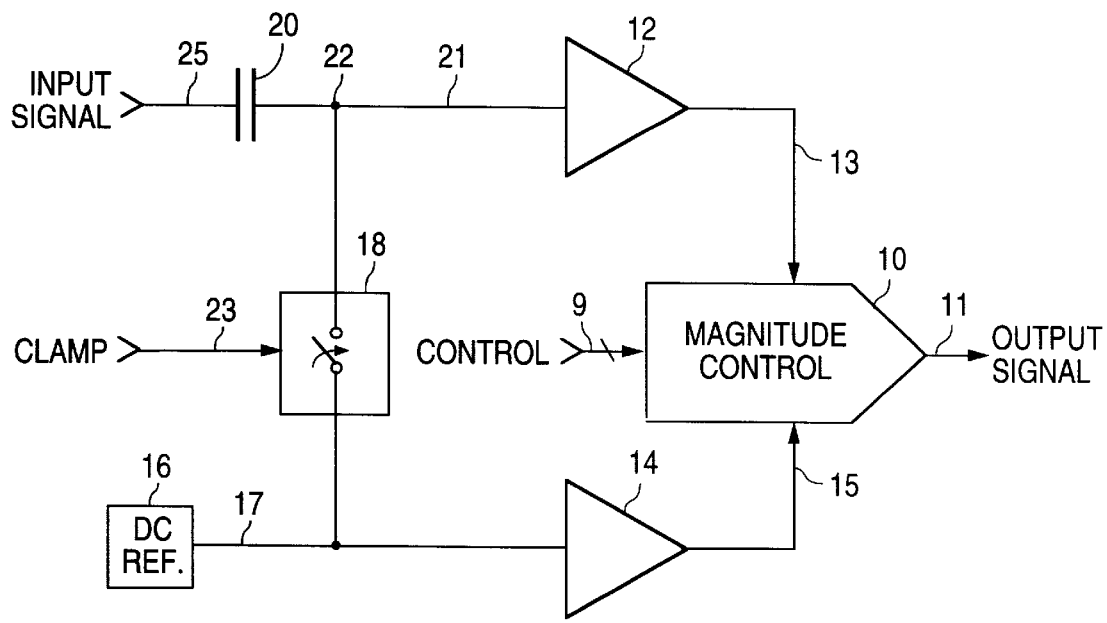
FIG. 28 is a functional block diagram of an analog signal system using a digitally controlled signal magnitude control circuit in accordance with one embodiment of the present invention.

Referring to FIG. 28, an analog signal system using a digitally controlled signal magnitude control circuit in accordance with one embodiment of the present invention includes a magnitude control circuit 10, buffer amplifiers 12, 14, a DC reference voltage source 16, a synchronous switching circuit 18 and a series coupling capacitor 20. The input signal 25, which typically includes both AC and DC signal components, is AC-coupled to node 22 where it is summed with the DC reference voltage 17, via the switch circuit 18, during the DC clamping intervals as defined by the clamp signal 23 (e.g., such as during the horizontal blanking interval in the case of a video input signal). This DC-clamped signal 21 is buffered by the buffer amplifier 12. The DC reference voltage 17 is also buffered by a buffer amplifier 14.

These buffered composite (i.e., AC and DC) 13 and DC 15 signals are provided to the magnitude control circuit 10. In accordance with a digital control signal 9, the output signal 11 is another composite signal. This signal 11 includes a DC component equal to the buffered DC reference voltage 15 (as well as the buffered DC component of the input composite signal 13). This signal 11 further includes an AC component which is equal to the buffered AC component of the input composite signal 13 multiplied by the transfer function of the stage 10 as determined by the digital control signal 9. (For example, if the digital control signal 9 defines an attenuation of 5 decibels, the AC component in the output signal 11 is 5 decibels less than the AC component of the input signal 13.)

Figure 29:
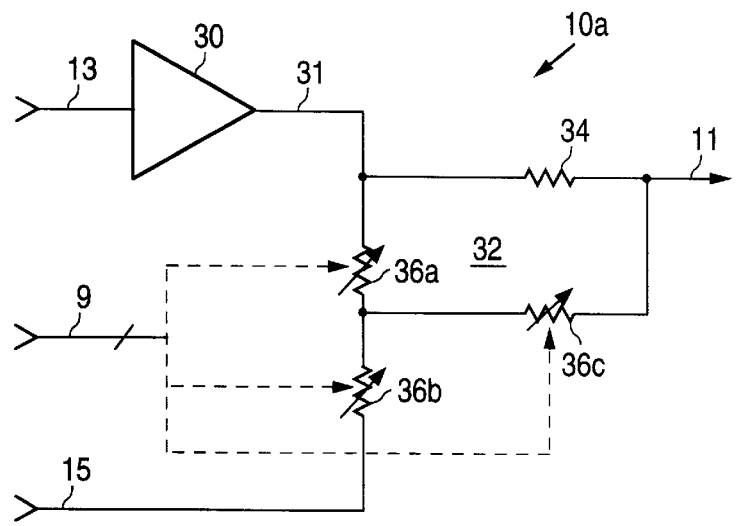
FIG. 29 is a circuit schematic diagram representing the operation of the digitally controlled signal magnitude control circuit of FIG. 28.

Referring to FIG. 29, the magnitude control circuit 10 of FIG. 28 can be represented by the embodiment 10a which includes an input buffer amplifier 30 and a digitally controlled resistive attenuator circuit 32. The DC reference voltage 15 is applied at the bottom, while the buffered composite signal 31 is applied at the top. In accordance with the digital control signal 9, variable resistances 36a, 36b, 36c are adjusted, thereby producing, in conjunction with a series resistance 34, a resistive attenuation factor. (Specific and more detailed embodiments of this resistive circuit 32 are discussed in more detail below.)

Figure 30:
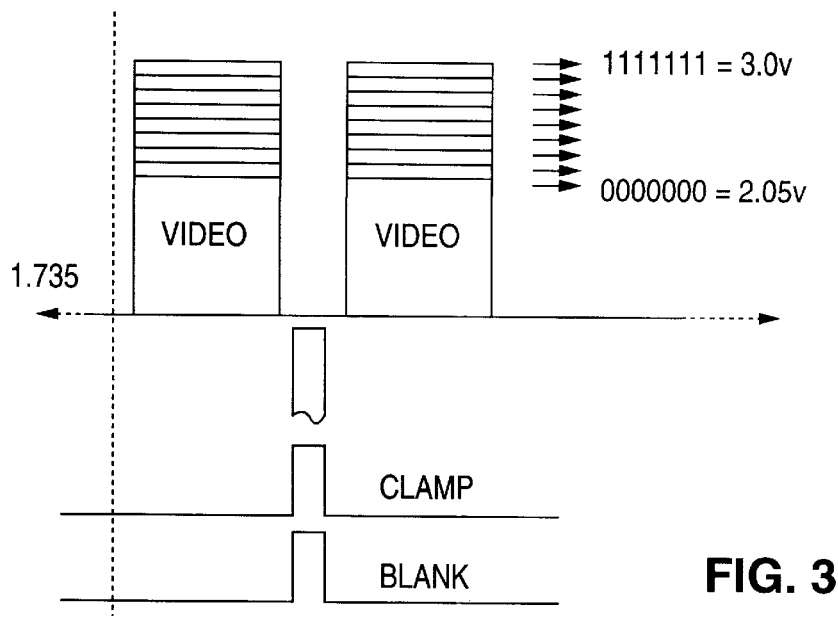
FIG. 30 is a signal diagram representing the signal magnitude control provided by the circuit of FIG. 28.

Referring to FIG. 30, operation of the circuit of FIG. 28 when used to process a clamped video signal can be better understood. During the horizontal blanking interval, the DC reference voltage 17 (FIG. 28) clamps the AC-coupled input signal. During the active video or OSD (on screen display) portions of the input signal 25, the digital control signal 9 determines the attenuation of the buffered composite signal 13 to establish the level of the output signal 11. In this example, for a 7-bit control signal 9, the output signal 11 can be adjusted over the range of 2.05 volts (maximum attenuation) through 3.0 volts (minimum attenuation).

Figure 31:
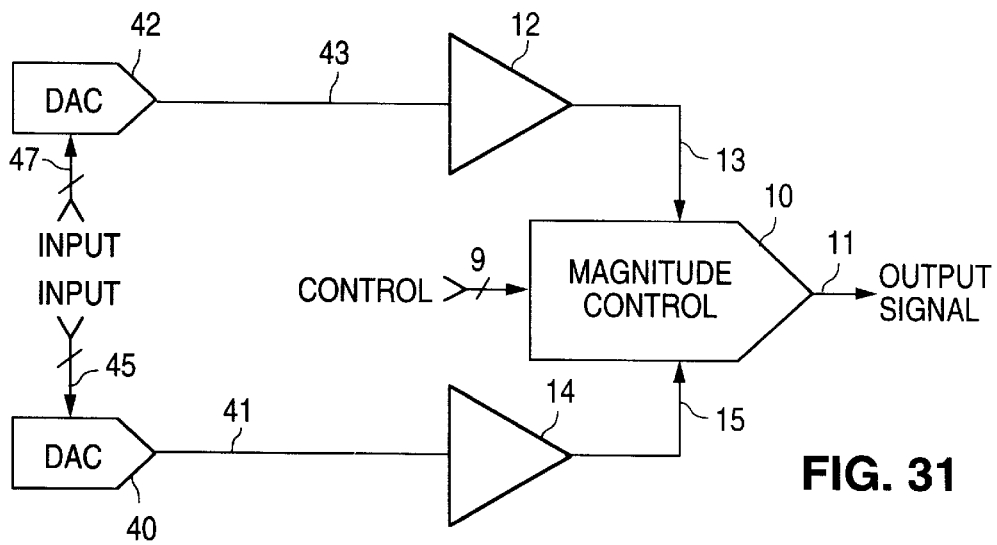
FIG. 31 is a functional block diagram of an analog signal system using a digitally controlled signal magnitude control circuit in accordance with another embodiment of the present invention.

Referring to FIG. 31, in accordance with another embodiment of the present invention, the magnitude control circuit 10 can be used to process, in accordance with the reference voltage 15, a variable DC voltage signal 13. In the case of a video signal system, for example, this voltage 13 can be the brightness control for the display monitor. A digital input signal 47 is varied in value in accordance with the desired brightness setting. This signal 47 drives a digital-to-analog converter circuit (DAC) 42, thereby producing a variable analog voltage signal 43 which is buffered by the buffer amplifier 12 to drive the top of the magnitude control circuit 10. Similarly, the DC reference source can be implemented using another DAC 40, thereby allowing the DC reference voltage 15 to also be established in accordance with a digital control signal 45.

Figure 32:
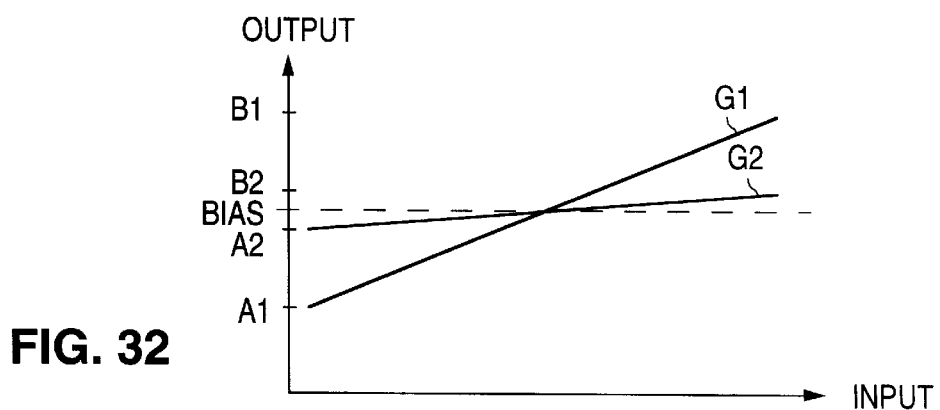
FIG. 32 is a graph representing the operation of the digitally controlled signal magnitude control circuit of FIG. 31 when used to control the attenuation profile of a variable DC signal.

Referring to FIG. 32, the effect of the digital control signal 9 upon the resulting variable DC output signal 11 from the circuit of FIG. 31 can be better understood. For a minimum attenuation (or maximum gain) as defined by the digital control signal 9, the output signal 11 will vary between values A1 and B1 with a slope G1 as shown. Conversely, for a maximum attenuation (or minimum gain), the output signal 11 will vary over a range of A2 through B2 with a slope of G2 as shown. These ranges can be shifted up (more positive) or down (more negative) in accordance with the bias voltage BIAS which is established by the DC reference voltage 15. These ranges of values of the variable DC output signal 11, as compared to the corresponding ranges of values of the input variable DC voltage signal 13, are determined by the attenuation factor established by the digital control signal 9.

Figure 33:
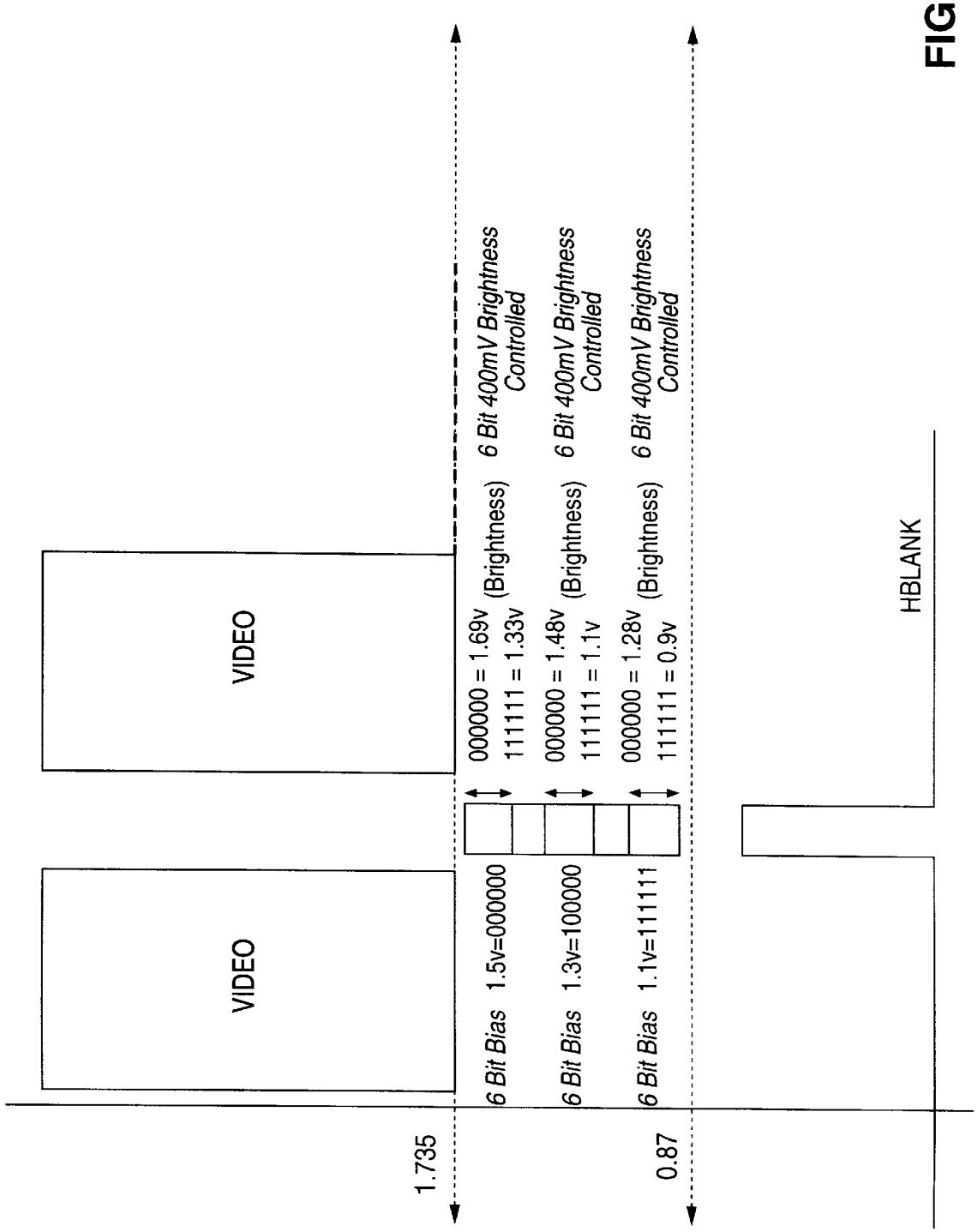
FIG. 33 is a signal diagram representing the signal magnitude control provided by the circuit of FIG. 31.

Referring to FIG. 33, operation of the circuit of FIG. 31 in a video signal system can be better understood. During the horizontal blanking interval, the brightness control range, as defined by the digital control signal 9, can be varied as shown. This control range, as noted above, can be shifted by varying the DC reference voltage in more positive or more negative directions. For example, for a DC reference, or bias, voltage of 1.3 volts (as established by the control signal 45 to the DC reference voltage source DAC 40) and a 400 millivolt brightness control voltage (as established by the brightness control signal 47), the digital magnitude control signal 9 can vary the brightness control output signal 11 over a range of 1.1 volts (maximum attenuation) through 1.48 volts (minimum attenuation).

Figure 34A:
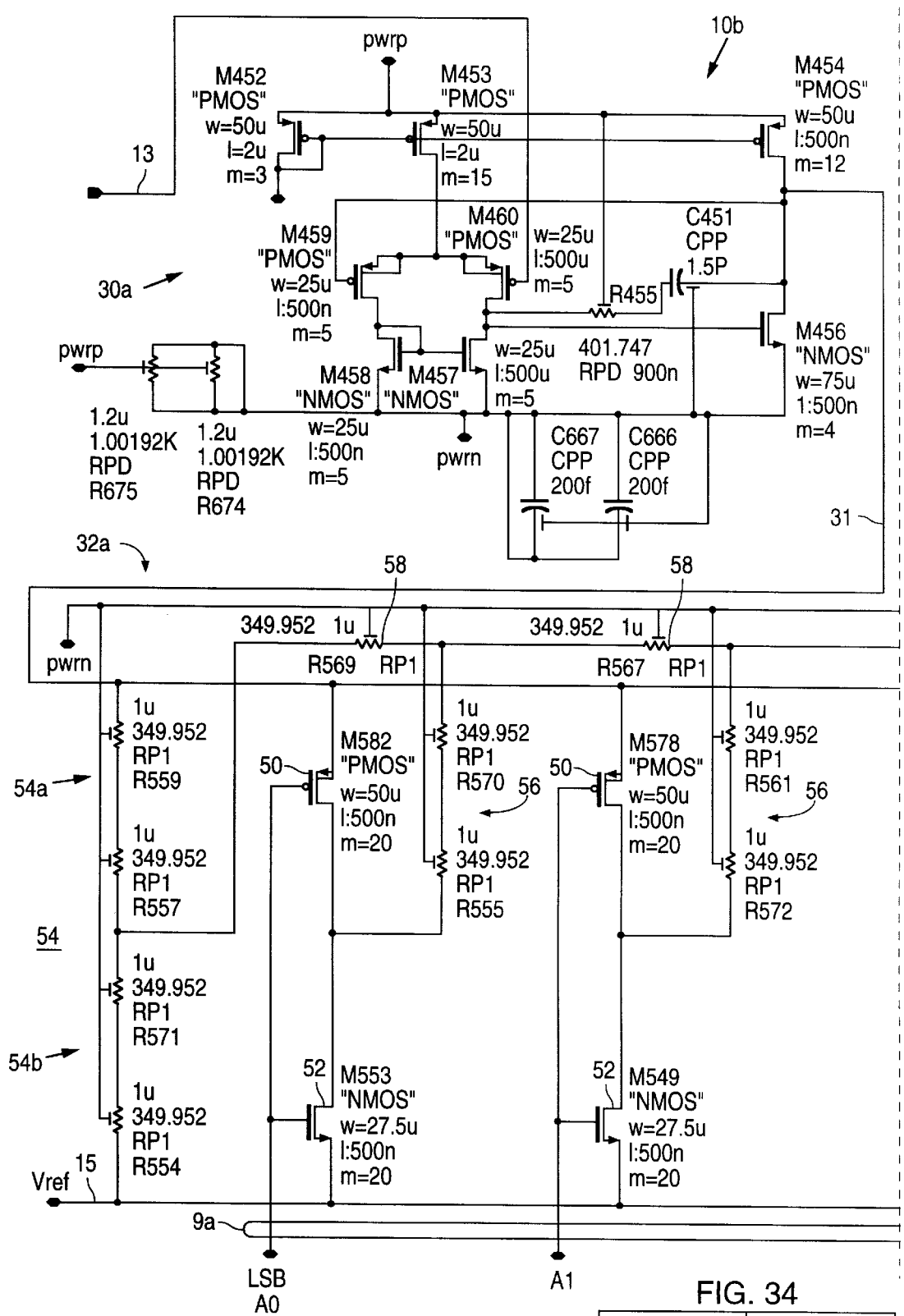
FIG. 34 is a circuit schematic diagram of an example embodiment of the digitally controlled signal magnitude control circuits of FIGS. 28 and 31.
Figure 34B:
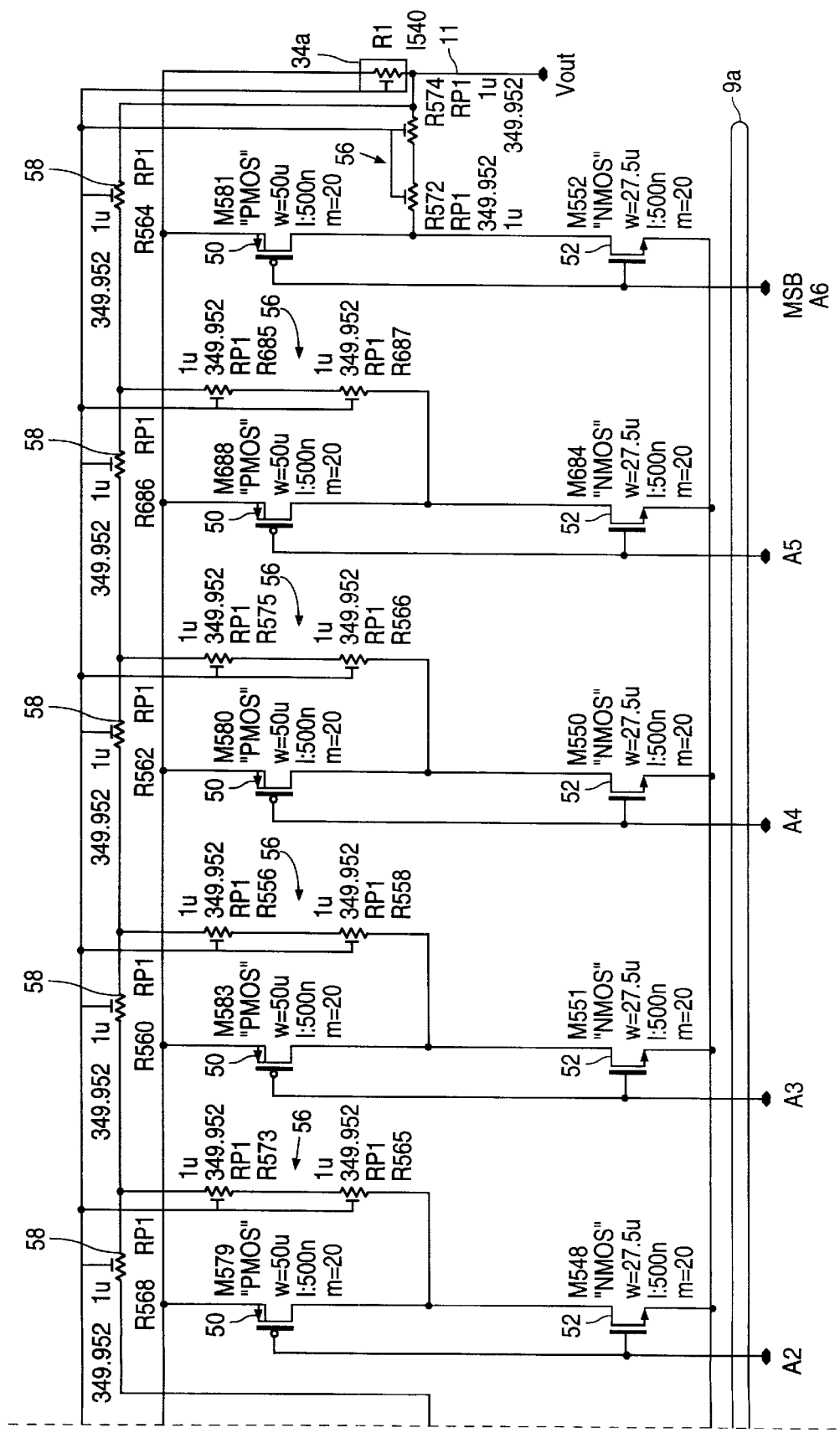

Referring to FIG. 34, one embodiment 10b of the magnitude control circuit 10 (FIGS. 28 and 31) can be implemented as shown. The input buffer amplifier 30 is implemented as a complementary MOSFET amplifier 30a. As discussed above (in connection with FIG. 29), the buffered signal 31 drives the top of the resistive array 32a, while the DC reference voltage 15 drives the bottom. Series-connected pass transistors in the form of P-type MOSFETs 50 and N-type MOSFETs 52 and a set of series resistances 54 are connected between the nodes driven by the signal 31 and reference voltage 15. (In this example, due to the integrated circuit structure being used, the various resistors 54, 56, 58 are implemented using MOSFET devices with fixed bias potentials (PWRP or PWRN, as appropriate) applied to their respective gate terminals.)

In accordance with the binary states of the bits A0–A6 (in this case 7 bits) of the digital control signal 9a, the pass transistors 50, 52 cause the bottom ends of resistor circuits 56 to be driven by either the buffered signal 31 or the reference voltage 15. This has the effect of connecting various permutations of series resistors 58 and shunt resistors 56 across either the upper portion 54a or lower portion 54b of the shunt resistive circuit 54 on the input side. The resulting net resistance interacts with the series fixed resistance 34a to produce the desired attenuation factor. This selective connecting of the various resistances in this manner produces the variable resistances 36a, 36b, 36c depicted in the circuit diagram of FIG. 29.

Figure 35A:
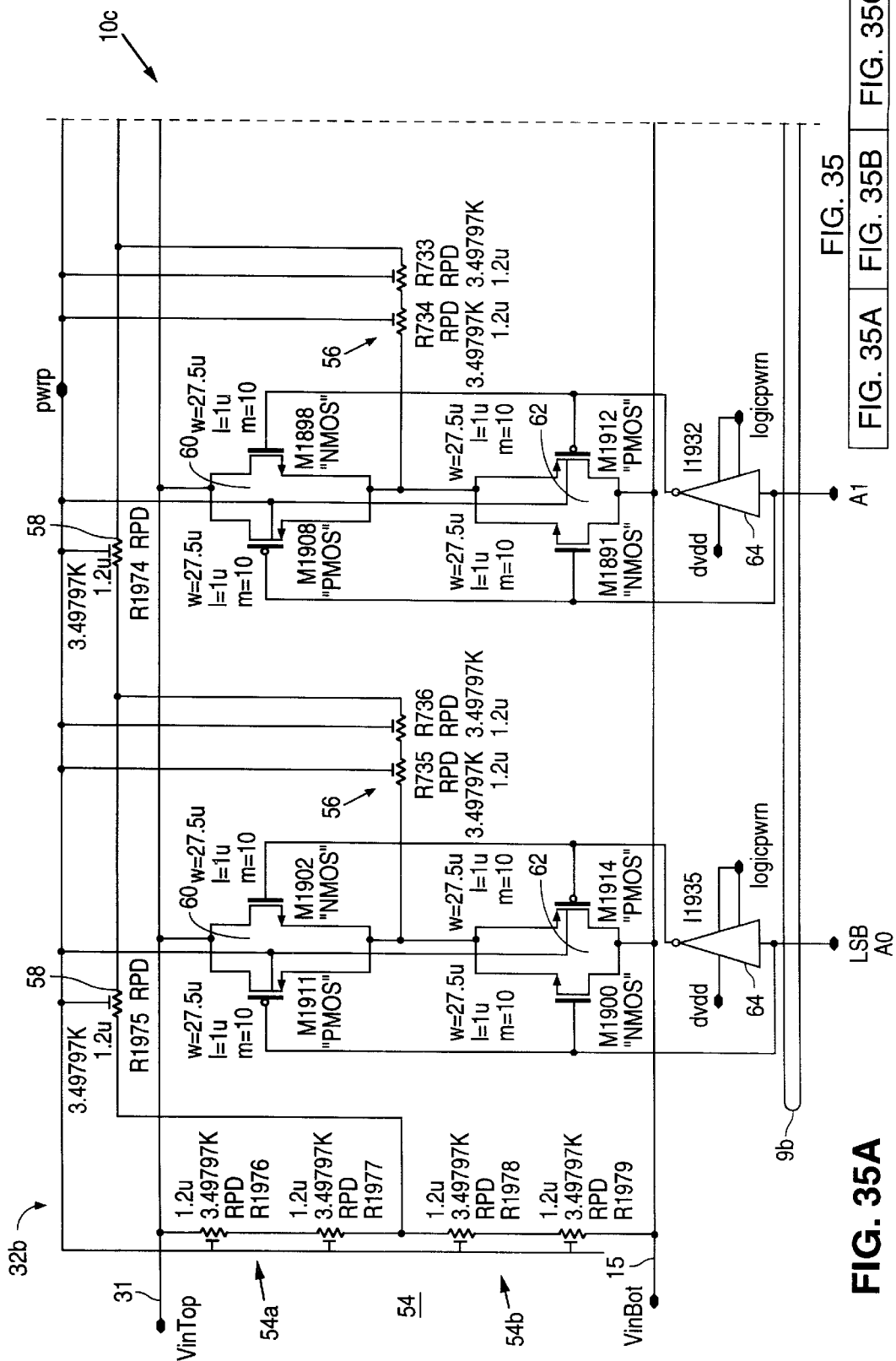
FIG. 35 is a circuit schematic diagram of another example embodiment of the digitally controlled signal magnitude control circuits of FIGS. 28 and 31.
Figure 35B:
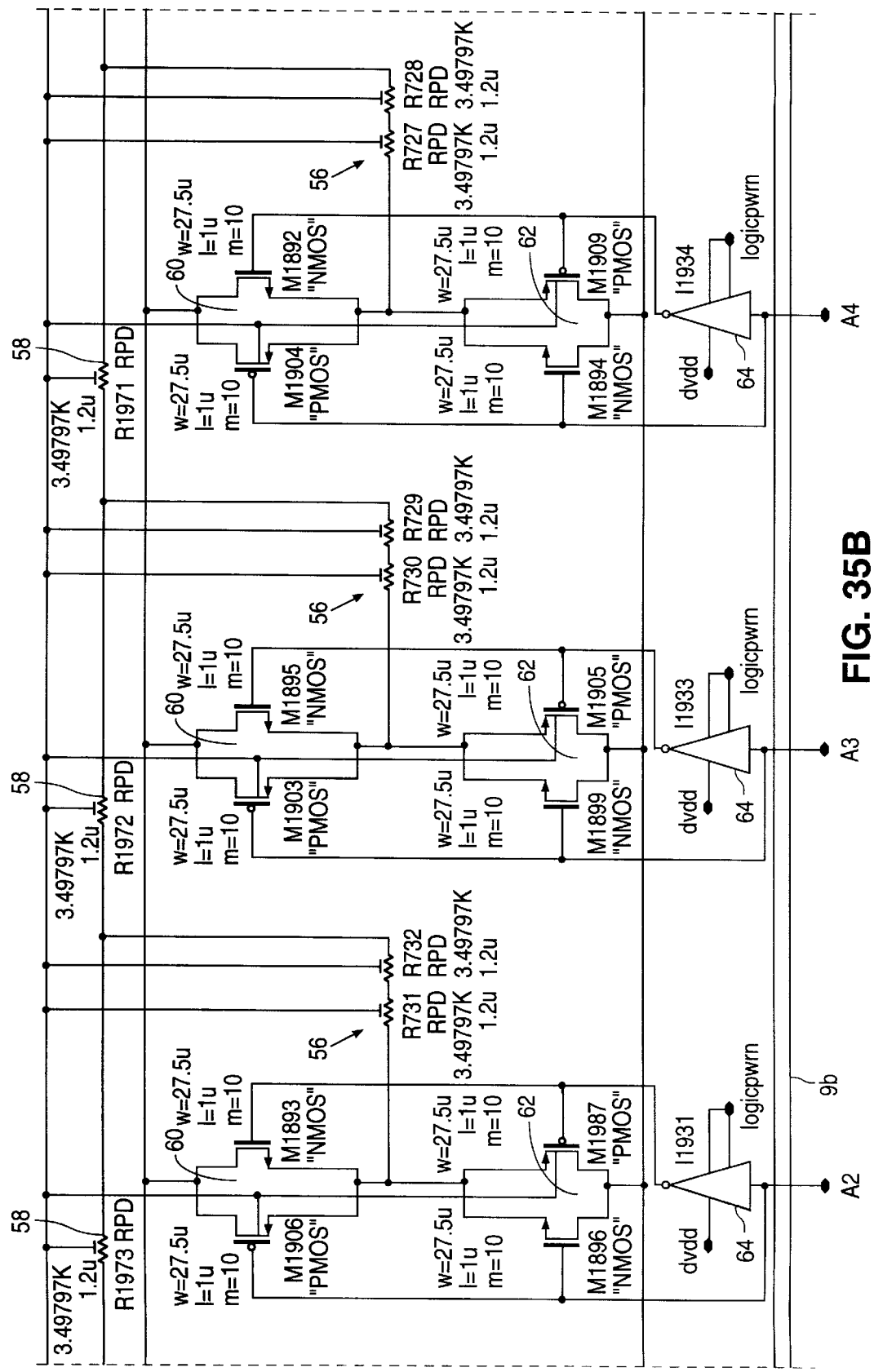
Figure 35C:
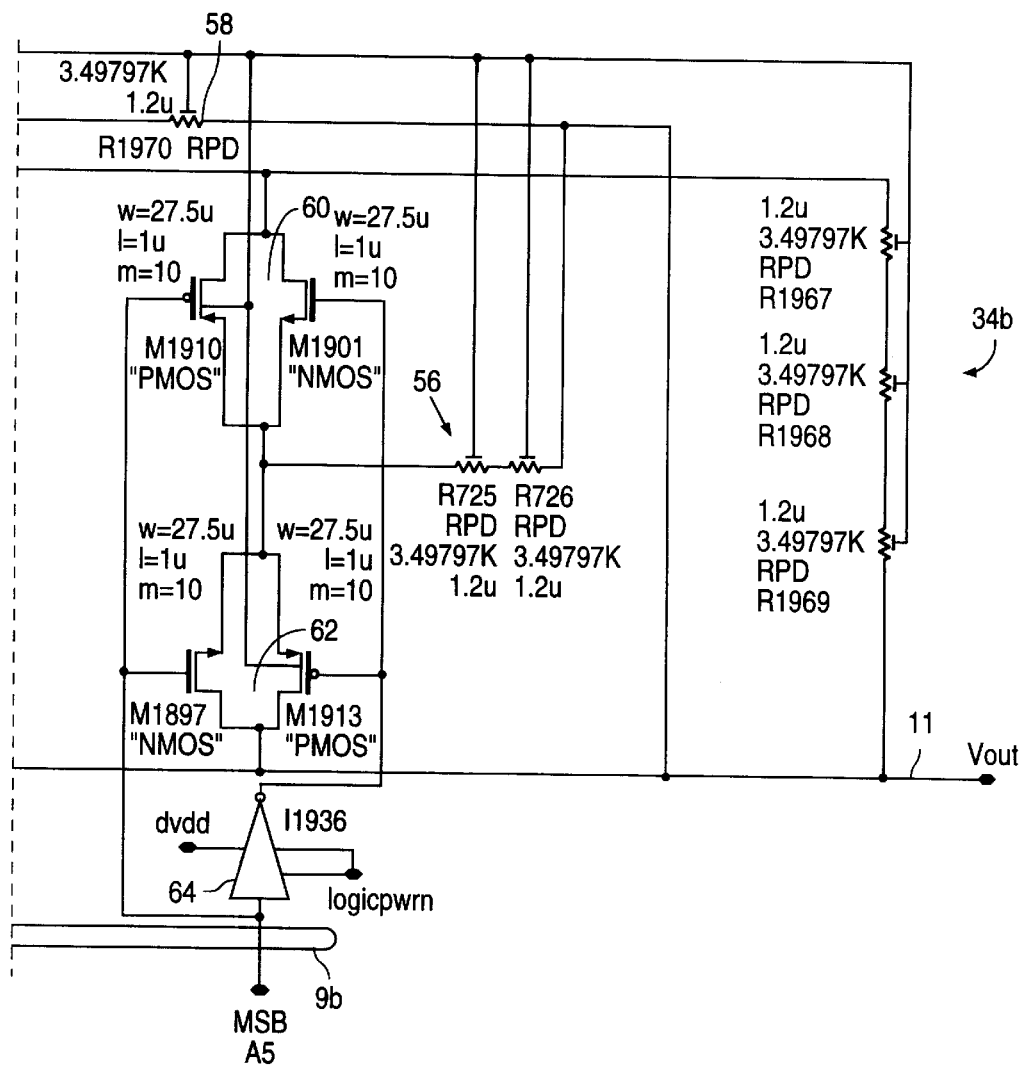

Referring to FIG. 35, another embodiment 10c of the magnitude control circuit 10 uses the same basic technique of switching resistances to produce the variable resistive network depicted in FIG. 29, but uses transmission gate circuits 60, 62 in place of the pass transistors 50, 52. Accordingly, the individual bits A0–A5 (in this case 6 bits) of the digital control signal 9b are also inverted using inverter circuits 64 for driving the transmission gate circuits 60, 62. This circuit 32b operates in an manner similar to that of the circuit 32a of FIG. 34. However, the transmission gate circuits 60, 62 provide improved isolation for when the incoming signal 31 is a variable DC voltage which may, at times, be more negative than the DC reference voltage 15. This allows the nodes driven by the signal 31 and reference voltage 15 to "flip" in polarity with respect to each other as needed. In other words, as shown in the graph of FIG. 32, the output signal 11 may sometimes be more negative than the DC reference voltage 15 providing the bias potential. Using transmission gate circuits 60, 62 allows this to be done more reliably.

Further information can be found in a product requirement specification, Appendix A attached hereto and incorporated herein by reference, and portions of a training manual, Appendix B attached hereto and incorporated herein by reference, for a chipset developed by the assignee National Semiconductor Corporation of Santa Clara, Calif.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a vertical blanking circuit and bias clamp boost supply, for amplifying a vertical blanking signal and generating a boosted DC voltage from said vertical blanking signal, comprising:

an amplifier circuit that provides an amplified vertical blanking signal with a peak-to-peak AC voltage magnitude in response to reception of an input vertical blanking signal;

a voltage restoration circuit, coupled to said amplifier circuit, that provides said amplified vertical blanking signal combined with a DC restoration voltage in response to reception of said amplified vertical blanking signal and said DC restoration voltage; and a voltage clamp circuit, coupled to said amplifier circuit, that provides a boosted DC voltage which is substantially equal to a sum of a DC clamp voltage and said peak-to-peak AC voltage magnitude in response to reception of said DC clamp voltage and said amplified vertical blanking signal.

2. The apparatus of claim 1, wherein said voltage restoration circuit comprises:

a first terminal for conveying said amplified vertical blanking signal;

a second terminal for conveying said DC restoration voltage;

a third terminal for conveying said combined amplified vertical blanking signal and DC restoration voltage;

a capacitive circuit coupled between said first and third terminals; and a resistive circuit coupled between said second and third terminals.

3. The apparatus of claim 1, wherein said voltage clamp circuit comprises:

a first terminal for conveying said amplified vertical blanking signal;

a second terminal for conveying said DC clamp voltage;

a third terminal;

a fourth terminal for conveying said boosted DC voltage;

a series capacitive circuit coupled between said first and third terminals;

a first diode coupled between said second and third terminals; and a second diode coupled between said third and fourth terminals.

4. The apparatus of claim 3, further comprising a shunt capacitive circuit coupled to said fourth terminal.

5. The apparatus of claim 1, wherein said amplifier circuit comprises:

a latch circuit that provides a latched signal having one of set and cleared signal states in response to reception of said input vertical blanking signal and a feedback comparison signal;

a logical OR circuit, coupled to said latch circuit, that provides a control signal having one of first and second signal states in response to reception of said input vertical blanking signal and said latched signal;

an output stage, coupled to said logical OR circuit, that provides one of first and second current-limited voltages in response to reception of said control signal; and a voltage comparison circuit, coupled between said output stage and said latch circuit, that provides said feedback comparison signal in response to reception and comparison of a reference voltage and said one of said first and second current-limited voltages.

6. The apparatus of claim 5, wherein said output stage comprises:

a first voltage source for providing said first current-limited voltage;

a second voltage source for providing said second current-limited voltage;

an output terminal for conveying said one of said first and second current-limited voltages; and a switching circuit, coupled between said first and second voltage sources and said output terminal, that provides said one of said first and second current-limited voltages in response to said reception of said control signal.

7. The apparatus of claim 1, wherein said amplifier circuit comprises:

an amplifier output terminal for conveying said amplified vertical blanking signal which includes an amplifier output current;

a latching circuit, coupled to said amplifier output terminal, that
operates in set and cleared latch states in response to reception of said input vertical blanking signal and said amplified vertical blanking signal, and
provides sink and source control signals in response to assertion of said input vertical blanking signal and in response to said operation in said set latch state;

a current sinking circuit, coupled between said latching circuit and said amplifier output terminal, that sinks said amplifier output current in response to said sink control signal and thereby provides a portion of said amplified vertical blanking signal; and a current sourcing circuit, coupled between said latching circuit and said amplifier output terminal, that sources said amplifier output current in response to said source control signal and thereby provides another portion of said amplified vertical blanking signal.

8. The apparatus of claim 7, wherein said latching circuit comprises a voltage follower circuit that buffers said input vertical blanking signal in response to reception thereof.

9. The apparatus of claim 7, wherein said latching circuit comprises a diode-connected transistor, coupled to said amplifier output terminal, that becomes conductive when said amplified vertical blanking signal transcends a predetermined threshold voltage and thereby causes said latching circuit to operate in said cleared latch state.

10. The apparatus of claim 7, wherein said latching circuit comprises first and second cross-connected transistors that maintain each other in respective conductive states in response to an assertion of said input vertical blanking signal.

11. The apparatus of claim 7, wherein said current sinking circuit comprises a common emitter amplifier circuit with an input terminal for receiving said sink control signal and an output terminal for sinking said amplifier output current.

12. The apparatus of claim 7, wherein said current sourcing circuit comprises a current mirror circuit that receives said source control signal as a current mirror input current and provides said amplifier output current as a current mirror output current.

13. An apparatus including an amplifier circuit for use in a vertical blanking circuit having a reduced startup time, said amplifier circuit comprising:

an amplifier input terminal for conveying an input vertical blanking signal;

an amplifier output terminal for conveying an amplified vertical blanking signal which includes an amplifier output current;

a latching circuit, coupled between said amplifier input and output terminals, that operates in set and cleared latch states in response to reception of said input vertical blanking signal and said amplified vertical blanking signal, and provides sink and source control signals in response to assertion of said input vertical blanking signal and in response to said operation in said set latch state;

a current sinking circuit, coupled between said latching circuit and said amplifier output terminal, that sinks said amplifier output current in response to said sink control signal and thereby provides a portion of said amplified vertical blanking signal; and a current sourcing circuit, coupled between said latching circuit and said amplifier output terminal, that sources said amplifier output current in response to said source control signal and thereby provides another portion of said amplified vertical blanking signal.

14. The apparatus of claim 13, wherein said latching circuit comprises a voltage follower circuit that buffers said input vertical blanking signal in response to reception thereof.

15. The apparatus of claim 13, wherein said latching circuit comprises a diode-connected transistor, coupled to said amplifier output terminal, that becomes conductive when said amplified vertical blanking signal transcends a predetermined threshold voltage and thereby causes said latching circuit to operate in said cleared latch state.

16. The apparatus of claim 13, wherein said latching circuit comprises first and second cross-connected transistors that maintain each other in respective conductive states in response to an assertion of said input vertical blanking signal.

17. The apparatus of claim 13, wherein said current sinking circuit comprises a common emitter amplifier circuit with an input terminal for receiving said sink control signal and an output terminal for sinking said amplifier output current.

18. The apparatus of claim 13, wherein said current sourcing circuit comprises a current mirror circuit that receives said source control signal as a current mirror input current and provides said amplifier output current as a current mirror output current.

19. A method for amplifying a vertical blanking signal and generating a boosted DC voltage from said vertical blanking signal, comprising the steps of:

receiving an input vertical blanking signal;

amplifying said input vertical blanking signal and thereby providing an amplified vertical blanking signal with a peak-to-peak AC voltage magnitude;

receiving a DC restoration voltage;

combining said amplified vertical blanking signal with said DC restoration voltage;

receiving a DC clamp voltage; and clamping said amplified vertical blanking signal and thereby providing a boosted DC voltage which is substantially equal to a sum of said DC clamp voltage and said peak-to-peak AC voltage magnitude.

20. The method of claim 19, wherein said amplified vertical blanking signal includes an amplifier output current and said step of amplifying said input vertical blanking signal and thereby providing an amplified vertical blanking signal comprises:

operating in set and cleared latch states in response to said input vertical blanking signal and said amplified vertical blanking signal;

generating sink and source control signals in response to assertion of said input vertical blanking signal and in response to said operation in said set latch state;

sinking said amplifier output current in response to said sink control signal and thereby generating a portion of said amplified vertical blanking signal; and sourcing said amplifier output current in response to said source control signal and thereby generating another portion of said amplified vertical blanking signal.

21. A method for amplifying a vertical blanking signal within a vertical blanking circuit having a reduced startup time, comprising the steps of:

receiving an input vertical blanking signal; and amplifying said input vertical blanking signal and thereby providing an amplified vertical blanking signal by
operating in set and cleared latch states in response to said input vertical blanking signal and said amplified vertical blanking signal,
generating sink and source control signals in response to assertion of said input vertical blanking signal and in response to said operation in said set latch state,
sinking said amplifier output current in response to said sink control signal and thereby generating a portion of said amplified vertical blanking signal, and
sourcing said amplifier output current in response to said source control signal and thereby generating another portion of said amplified vertical blanking signal.

\* \* \* \* \*